United States Patent [19]

Hama

[11] Patent Number: 5,532,705
[45] Date of Patent: *Jul. 2, 1996

[54] WRIST-MOUNTED-TYPE ANTENNA DEVICE AND APPARATUS HAVING THE ANTENNA DEVICE

[75] Inventor: Norio Hama, Suwa, Japan

[73] Assignee: Seiko Epson Corporation, Tokyo, Japan

[*] Notice: The term of this patent shall not exend beyond the expiration date of Pat. No. 5,465,098.

[21] Appl. No.: 214,412

[22] Filed: Mar. 17, 1994

[30] Foreign Application Priority Data

| Mar. 17, 1993 | [JP] | Japan | 5-057428 |
| Mar. 17, 1993 | [JP] | Japan | 5-057432 |
| Mar. 29, 1993 | [JP] | Japan | 5-070384 |

[51] Int. Cl.$^6$ ................................. H01Q 1/18
[52] U.S. Cl. .................... 343/718; 343/702; 343/749; 343/767; 455/351
[58] Field of Search ............................... 343/702, 718, 343/720, 741, 743, 745, 746, 749, 752, 767, 850, 866, 868; 455/351; H01Q 1/12, 11/12, 1/00, 1/44, 1/27, 1/24

[56] References Cited

U.S. PATENT DOCUMENTS

| 2,629,051 | 2/1953 | Lindenblad | 343/767 |
| 3,210,766 | 10/1965 | Parker | 343/743 |
| 3,918,062 | 11/1975 | Haruki et al. | 343/702 |
| 4,419,770 | 12/1983 | Yagi et al. | 455/351 X |
| 4,713,808 | 12/1987 | Gaskill et al. | 370/94 |
| 4,817,196 | 3/1989 | MacNak et al. | 343/718 X |
| 4,862,181 | 8/1989 | Ponce De Leon et al. | 343/702 |
| 4,862,516 | 8/1989 | MacNak et al. | 343/718 X |
| 4,873,527 | 10/1989 | Tan | 343/718 |
| 4,884,252 | 11/1989 | Teodoridis et al. | 455/344 X |
| 4,973,944 | 11/1990 | Maletta | 343/718 X |
| 4,975,711 | 12/1990 | Lee | 343/702 |
| 4,977,614 | 12/1990 | Kurcbart | 343/718 X |
| 5,001,778 | 3/1991 | Ushiyama et al. | 343/700 MS X |
| 5,007,105 | 4/1991 | Kudoh et al. | 343/718 X |
| 5,128,686 | 7/1992 | Tan et al. | 343/718 |
| 5,132,697 | 7/1992 | Tan | 343/718 |
| 5,134,418 | 7/1992 | Gomez et al. | 343/718 |
| 5,134,724 | 7/1992 | Gehring et al. | 343/718 X |
| 5,144,325 | 9/1992 | Kurcbart | 343/718 |
| 5,179,733 | 1/1993 | Matsui | 343/718 X |
| 5,182,568 | 1/1993 | Stamps, Jr. et al. | 343/702 |
| 5,227,804 | 7/1993 | Oda | 343/702 |
| 5,280,296 | 1/1994 | Tan et al. | 343/718 |
| 5,280,646 | 1/1994 | Koyama et al. | 343/718 X |

FOREIGN PATENT DOCUMENTS

| 0122485 | 10/1984 | European Pat. Off. | H01Q 1/24 |
| 0372430 | 6/1990 | European Pat. Off. | H01Q 1/27 |
| 0538485 | 4/1993 | European Pat. Off. | H01Q 1/27 |
| 0565725A1 | 10/1993 | European Pat. Off. | H01Q 1/44 |
| 31-5906 | 7/1956 | Japan | H01Q 1/32 |
| 55-12762 | 4/1980 | Japan | H01Q 21/06 |
| 56-27514 | 3/1981 | Japan | H01Q 7/00 |
| 56-169401 | 12/1981 | Japan | H01Q 1/44 |
| 58-94204 | 6/1983 | Japan | H01Q 7/08 |
| 59-44103 | 3/1984 | Japan | H01Q 3/00 |
| 61-26307 | 2/1986 | Japan | H01Q 9/30 |
| 61-200702 | 9/1986 | Japan | H01Q 1/24 |
| 61-50542 | 11/1986 | Japan | H01Q 3/24 |
| 62-24705 | 2/1987 | Japan | H01Q 7/08 |
| 63-163185 | 7/1988 | Japan | G01S 13/74 |
| 0140002 | 5/1990 | Japan | H01Q 1/44 |
| 3-88404 | 4/1991 | Japan | H01Q 7/00 |
| 3147406 | 6/1991 | Japan | H01Q 7/00 |
| 3-181208 | 8/1991 | Japan | H01Q 13/18 |
| 4211522 | 8/1992 | Japan | H01Q 1/44 |
| 2201266 | 8/1988 | United Kingdom | 343/718 |
| 2217112 | 10/1989 | United Kingdom | H01Q 1/38 |
| WO91/02386 | 2/1991 | WIPO | H01Q 1/24 |

OTHER PUBLICATIONS

Hideo Ito et al., "A Small–Loop Antenna for Pocket–Size VHF Radio Equipment," *National Technical Report*, vol. 19 No. 2, Apr. 1973.

*Primary Examiner*—Donald T. Hajec
*Assistant Examiner*—Steven Wigmore
*Attorney, Agent, or Firm*—Oliff & Berridge

[57] ABSTRACT

A wrist-mounted-type portable radio apparatus includes a main body having a front surface that faces away from the user's wrist, a rear surface that faces the user's wrist when mounted around the user's wrist, a circuit board having electrical circuitry and arranged in the main body, and wrist bands connected to the main body for mounting the device around the user's wrist. The radio apparatus also includes an antenna assembly fixed in the main body and the wrist bands, and arranged in the main body so that it is positioned on a side of the circuit board facing the front surface of the main body. Because the circuit board is not disposed on the front surface side of the antenna assembly, a radiation wave generated by the antenna assembly is not disturbed. Therefore, the wrist-mounted-type antenna device has high directivity and sensitivity.

46 Claims, 28 Drawing Sheets

WRIST-MOUNTED-TYPE ANTENNA DEVICE AND APPARATUS HAVING THE ANTENNA DEVICE

BACKGROUND OF THE INVENTION

1. Field of the Invention

The present invention relates to a wrist-mounted-type antenna device that is mounted on a wrist-mounted-type apparatus that transmits and/or receives signals, such as a pager, a TV, a receiver, a transmitter, a radio, for example. In particular, the invention relates to improvements of the inner structure thereof.

2. Description of Related Art

Conventionally, a small-sized portable apparatus, such as a TV, a receiver, a transmitter, or a pager (hereinafter collectively referred to as a "radio apparatus") is generally provided with an antenna of the loop type. The electrical operational theory and structure of this type of antenna is disclosed, for example, in the paper titled "A loop antenna for a small-sized portable radio set" published in "National Technical Report Vol. 19, No. 2, Apr. 1973". It also has been known that a loop antenna is provided at its central portion (in the longitudinal direction of the loop) with a reactance element such as a capacitor. In addition, when the radio frequency is relatively high, an inverted F type antenna is sometimes utilized for the radio apparatus.

One type of small-sized portable radio apparatus that has been developed is a wrist-mounted-type portable radio apparatus capable of being mounted around the user's wrist. Typical examples of the wrist-mounted-type portable radio apparatus are disclosed in U.S. Pat. No. 4,713,808 to Gaskill et al., wherein a loop antenna is provided, and in Japanese Laid-Open Patent Application No. 4-211522, wherein a short dipole antenna is provided.

However, when the loop antenna or the dipole antenna is utilized in the wrist-mounted-type portable radio apparatus, since the antenna is arranged in a state in which it contacts the user's wrist when the radio apparatus is mounted to the user, the directivity sensitivity of the antenna is degraded, and therefore satisfactory operation of the antenna cannot be expected.

The present inventor has proposed to use a slot antenna for a wrist-mounted-type portable radio apparatus and the like. The slot antenna is assembled in the wrist-mounted-type portable radio apparatus so that an electrically conductive plate forming a part of the slot antenna is accommodated in the main body of the radio apparatus, while another electrically conductive plate forming a remaining part of the slot antenna is arranged in wrist bands of the radio apparatus. These electrically conductive plates are connected to each other to form the slot antenna. In this wrist-mounted-type of portable radio apparatus having the slot antenna as described above, the inductance value of the antenna is defined by the circumferential length of the slot and the width of the electrically conductive plate of the antenna. The inductance value of the antenna is not affected by the length of the wrist bands when mounted around the user's wrist. Therefore, this antenna is advantageous because a high antenna gain can be maintained even if the size of the user's wrist varies. In addition, when mounted around the user's wrist, the slot antenna is arranged such that the slot faces outwardly, and therefore, the slot antenna advantageously is capable of detecting magnetic field contents generated around the body surface or wrist of the user.

However, because a wrist-mounted-type portable radio apparatus having a higher sensitivity has been demanded, there is a problem that a higher sensitivity of this type of radio apparatus cannot be expected by assembling the slot antenna therein in a conventional manner. The reasons are as follows:

First, in the wrist-mounted-type portable radio apparatus having the slot antenna, the radio signal receiving portion is electrically connected to the slot antenna. The connecting point defines the feed point of the antenna, which inevitably is located near the center portion of the slot antenna (relative to the longitudinal direction thereof). As a result, this feed point is situated in the main body of the radio apparatus, which has a variety of circuit components accommodated therein. An area around the center portion where the feed point is located also is the portion of the antenna where the radiated energy of the electrical waves is at a maximum. However, in the restricted space of the main body of the radio apparatus near this feed point, a variety of components comprised of dielectric materials, insulating materials, attenuation materials, electrically conductive materials or the like are arranged. If the components comprised of attenuation materials or electrically conductive materials are arranged along the radial direction of the electrical waves, the radiated energy may be insulated or degraded (damped) by these components, which causes deterioration of the sensitivity of the slot antenna.

Second, in the restricted thin space of the main body of the radio apparatus, circuit components that generate noise signals adversely affecting the transmitting and receiving sensitivities of the radio apparatus are arranged around the center portion of the slot antenna. These circuit components include digital-signal processing circuits, voltage up converted circuits (e.g., a DC/DC converter), and the like. The noise signals become transmission noises and radiation noises, which cause degradation of the sensitivity of the radio apparatus. When some types of circuit systems are adopted, the radiation noises may cause not only the radio itself, but also other radio apparatus to be disturbed.

Third, since the slot antenna is provided at its center portion with the reactance element (which is provided in order to resonate at a specific frequency), the portion of the slot antenna located in the main body of the radio apparatus is in a high impedance state. Thus, the value of Q of the antenna circuitry increases, so that the antenna impedance is adversely affected by the human body when the radio apparatus is mounted on the user's wrist. As a result, the most appropriate matching condition between the radio receiving section and the antenna section is deteriorated, whereby the transmitting and receiving sensitivity may be degraded. While it is possible to lower the value of Q by arranging an additional electrical element in the circuitry of the radio apparatus, this is not recommended because it prevents the down-sizing of the wrist-mounted-type portable radio apparatus.

Fourth, in the wrist-mounted-type portable radio apparatus, because the slot antenna is partially fixed to the wrist bands, it must be increased in mechanical strength. This means that an increase in the electrical resistance loss of the slot antenna must be accepted.

SUMMARY OF THE INVENTION

Therefore, an object of the present invention is to provide a wrist-mounted-type antenna device that has a slot antenna of an improved structure capable of enhancing further the sensitivity of the radio apparatus.

Another object of the present invention is to provide a radio apparatus having the above wrist-mounted-type antenna device, whereby the sensitivity thereof can be improved.

In order to achieve the above and other objects, according to the present invention, a wrist-mounted-type antenna device includes a main body having a front surface facing away from the user's wrist, a rear surface facing toward the user's wrist when mounted around the user's wrist, a circuit board located in the main body and having electrical circuitry thereon, and wrist bands connected to the main body for mounting the device around the user's wrist. The antenna device also has a slotted, antenna assembly in the wrist bands and extending across the main body. The slot extends along the length of the antenna device in both wrist bands and through the main body. The antenna assembly is arranged in the main body so that it is positioned on a side of the circuit board that faces toward the front surface of the main body. In the wrist-mounted-type antenna device according to the present invention, since the circuit board is not disposed on the front surface side of the antenna assembly, a radiation wave generated by the antenna assembly is not shielded by the circuit board. Therefore, the wrist-mounted-type antenna device according to the present invention has a high directivity and sensitivity.

In order to improve the gain of the antenna assembly, a reflective member may be installed in the main body behind the antenna device. When a displaying unit is located on the front surface of the main body, the antenna assembly can be arranged to the sides of the displaying unit. Alternatively, the antenna assembly may be formed by a transparent thin conductive film over the displaying unit. If the main body has an outer frame, the antenna assembly may be disposed on the outer frame so that the slot extends along a peripheral surface of the outer frame.

In order to prevent noise, thereby realizing a radio set having a high sensitivity, the wrist-mounted-type antenna device according to the present invention can have a first member connected to a reference voltage side of a high frequency wave amplifier, and a second member (located on an opposite side of the slot from the first member) connected to a signal (i.e., feed) voltage side of the high frequency wave amplifier. The first member has a low impedance and is disposed near noise sources contained in the circuits arranged on the circuit board. The second member has a high impedance and is disposed farther from the noise sources.

In addition, the wrist-mounted-type antenna device according to the present invention is arranged to have an optimum electric power feeding point to the antenna assembly in order to obtain a high sensitivity. The wrist-mounted-type antenna device according to this aspect of the invention includes antenna elements having different lengths with respect to the main body. Therefore, the power feeding point can be separated from the connection point of the reactance element which must be located near the center of the antenna assembly. In particular, the reactance element can be arranged in the wrist band using an overlapping portion that projects from portions of the antenna plate located on opposite sides of the slot in the wrist band.

When space can be maintained between the antenna assembly and the human body, the above effects from the human body can be reduced. Therefore, the wrist-mounted-type antenna device has holes, an increased thickness, raised areas and the like on the rear surface side of the wrist band near the position that corresponds to the high impedance part of the antenna assembly to increase the spacing or provide a smaller area of the antenna assembly in that area.

In addition to the above features, the wrist-mounted-type antenna apparatus according to another aspect of the invention can have structure for reducing the loss of resistivity at the distal end of the antenna assembly, thus further upgrading the sensitivity. The wrist-mounted-type antenna device can have a high dielectric material layer on the surface of the antenna assembly to catch a longer wave length radiation wave without increasing the length of the antenna assembly.

The above and other objects and advantages will be apparent from reading the following description in connection with the attached drawings.

DETAILED DESCRIPTION OF PREFERRED EMBODIMENTS

While the present invention will be described with reference to the preferred embodiments, it will be understood that the present invention is not limited to these embodiments. On the contrary, it is intended to cover all alternatives, modifications, and equivalents as may be included within the spirit and scope of the invention as defined by the attached claims.

First Embodiment

Figure 1A:
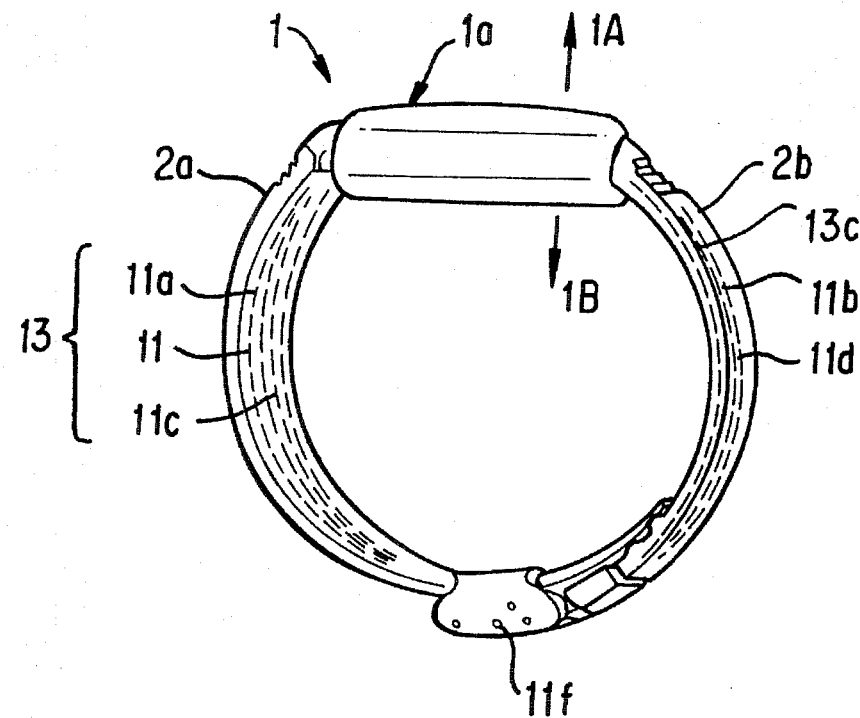
FIG. 1A is a perspective view of a wrist-mounted-type portable radio apparatus according to a first embodiment of the present invention.
Figure 1B:
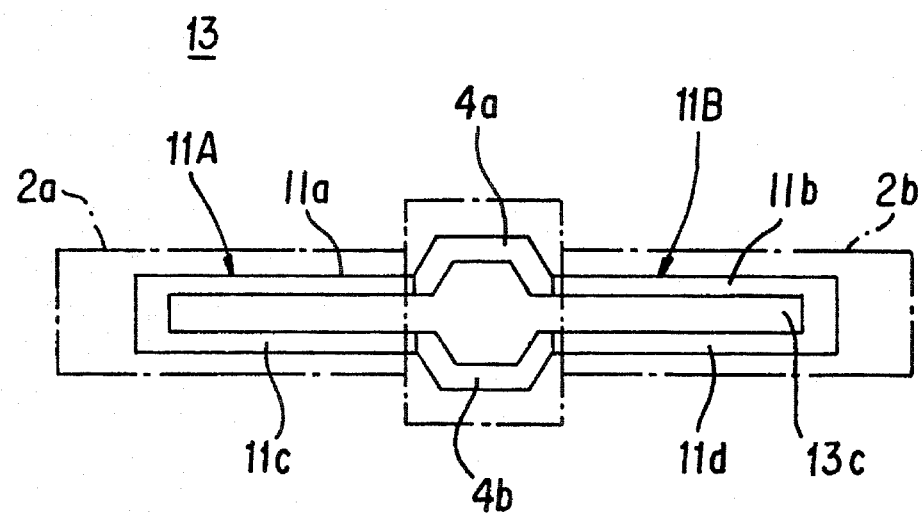
FIG. 1B shows an antenna assembly in the FIG. 1A apparatus.
Figure 2:
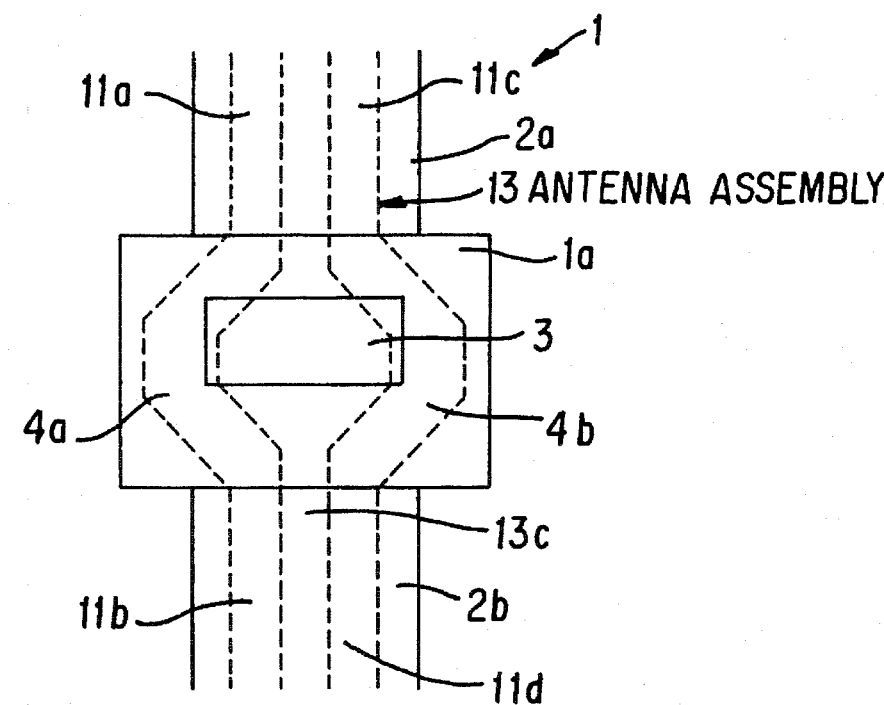
FIG. 2 illustrates the arrangement of a slot antenna in a main body of the radio apparatus of FIG. 1A.
Figure 3:
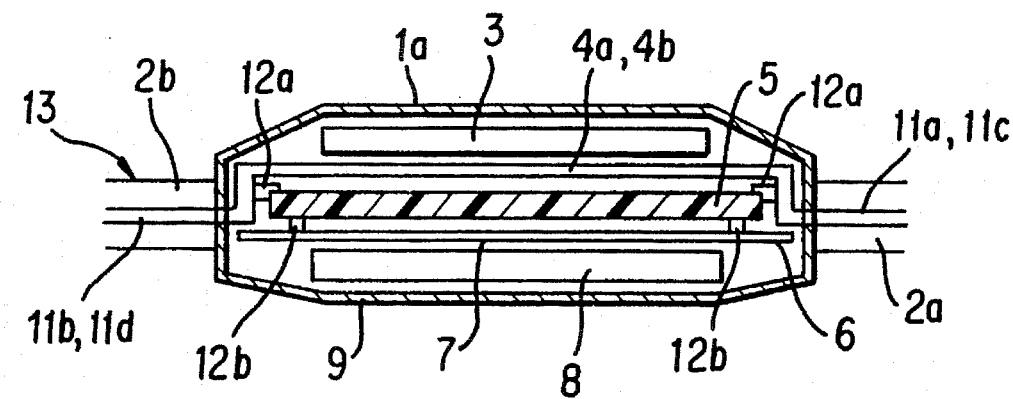
FIG. 3 is a cross-sectional view of the main body of the wrist-mounted-type radio apparatus of FIG. 1A.

FIG. 1A is a perspective view of a first embodiment of a wrist-mounted-type portable radio apparatus according to the present invention. FIG. 1B shows an antenna assembly arranged in the radio apparatus. FIG. 2 illustrates the arrangement of a slot antenna in a main body of the radio apparatus of FIG. 1, and FIG. 3 is a cross-sectional view of the main body of the wrist-mounted-type radio apparatus of FIG. 1.

Referring to these figures, the wrist-mounted-type portable radio apparatus has a main body 1a, a pair of wrist bands 2a, 2b connected to both sides of the main body 1a, and an antenna assembly 13 arranged in the main body 1a and the wrist bands 2a, 2b. The wrist bands 2a and 2b are releaseably connected at their distal ends with each other by means of a clasp 1f.

As shown in FIG. 1B, the antenna assembly 13 is comprised of an antenna plate 11A fixed in the wrist band a, an antenna plate 11B fixed in the other wrist band 2b, and a pair of electrically conductive plates 4a, 4b arranged in and extending through the main body 1a for electrically connecting the antenna plates 11A and 11B with each other. Further, the antenna elements 11a and 11c are electrically connected at their ends, and similarly the antenna elements 11b and 11d also are electrically connected at their ends, whereby a slot 13c is defined by the above elements comprising the antenna assembly 13. Although the wrist bands 2a and 2b are connected by the clasp 1f, it is not necessary for the antenna plates 11A and 11B to be electrically connected to each other at their ends. However, the distal ends of plates 11A and 11B could be electrically connected.

The main body 1a of the radio apparatus 1 has a front surface 1A and a rear surface 1B. When the radio apparatus 1 is mounted around the user's wrist, the rear surface 1B is positioned to face and contact the user's wrist, while the front surface 1A is positioned opposite from the user's wrist and faces away from the wrist.

As shown in FIG. 2, the main body 1a of the radio apparatus 1 has a data displaying unit such as LCD 3, and the electrically conductive plates 4a, 4b, both arranged at the side near the front surface 1A of main body 1a.

In the main body 1a of the portable radio apparatus 1, as shown in FIG. 3, the displaying unit 3, the electrically conductive plates 4a, 4b, a circuit board 5, an electrically-conductive reflective plate 6, and a battery 8 are arranged in that order when viewed from the front surface 1A to a rear case 9 of the main body 1a. The circuit board 5 has respective circuit portions mounted thereon and a wire pattern for a high frequency ground (not shown) formed thereon. When a multi-layered circuit board is utilized as the circuit board 5, the wire pattern for a high frequency ground is formed in an inner-layered portion thereof. The reflective plate 6 is connected to one of the poles of the battery 8 via a terminal plate 7 so that a property of the high frequency ground at the rear side of the electrically conductive plates 4a, 4b is surely maintained appropriate. The battery 8 easily can be replaced by a new battery by removing the rear case 9. The rear case 9 is electrically connected to the other pole of the battery 8 and also electrically connected to the circuit board 5 via a terminal plate (not shown). The circuit board 5 is electrically connected to the reflective plate 6 by means of a pair of connectors 12b, 12b.

In the present embodiment, the circuit board 5 is arranged at the rear side of (i.e., beneath) the electrically conductive plates 4a and 4b of the antenna assembly 13, and is connected electrically thereto by a pair of terminal plates 12a, 12a. These connecting portions define a feed point to the antenna assembly 13, or a connecting point for a reactance element. Therefore, in the antenna assembly 13, portions of the antenna plates 11a, 11b (or 11c, 11d) adjacent to the feed point and the electrically conductive plate 4a (or 4b) are the portions of the antenna that exhibit high frequency impedance and radiate electric waves of the strongest magnitude compared to the other portions of the antenna assembly 13.

In the wrist-mounted-type portable radio apparatus 1 as constructed above, a radio wave is transmitted and received through the front surface 1A on which the displaying unit 3 is mounted. Therefore the antenna assembly 13 is constructed to have the directivity on its front surface 1A, thereby reducing loss.

Namely, the circuit board 5 and the reflective plate 6, both attached to the high frequency ground, are arranged on the rear side of (i.e., beneath) the electrically conductive plates 4a and 4b so as to exert their reflective ability, thereby focussing the directivity toward the front surface 1A. In addition, when the wrist-mounted-type portable radio apparatus 1 is mounted on the user's wrist, the wrist contacts the rear case 9 thereof. However, the antenna assembly 13 is shielded from the user's wrist by the rear case 9 and the reflective plate 6. Therefore, the antenna assembly 13 is not affected by the human body so that its impedance does not deviate and its sensitivity remains high.

Details of the above advantages will now be explained referring to FIGS. 4A, 4B and FIG. 5 with respect to the wrist-mounted-type portable radio apparatus operation.

Figure 4A:
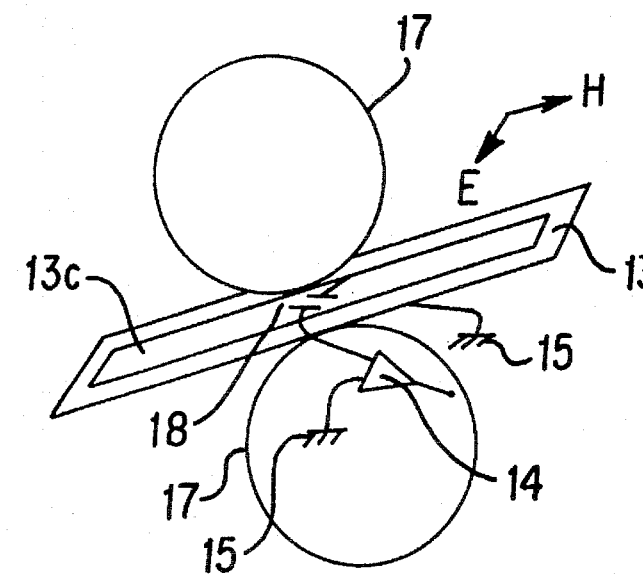
FIGS. 4A illustrates a general directivity of a slot antenna.

FIG. 4A illustrates the general directivity of a slot antenna. FIG. 4B illustrates the directivity of the present antenna. FIG. 5 is a block diagram showing a circuitry arrangement using the present wrist-mounted-type portable radio apparatus as a personal pager portable radio apparatus.

Figure 4B:
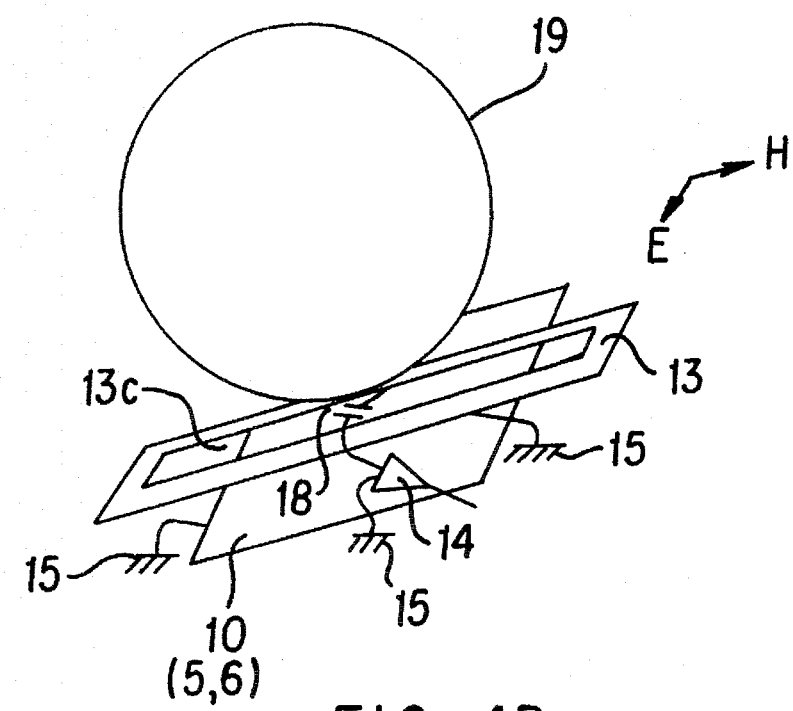
FIG. 4B illustrates a directivity of a slot antenna of the wrist-mounted-type radio apparatus of FIG. 1A.

In FIGS. 4A and 4B, the antenna assembly 13 has the slot 13c disposed along the center line thereof. A capacitor 18 that functions as a reactance element is arranged near the center of the slot and connects conductive portions of the antenna across the slot 13c. When the capacitor 18 has an appropriate capacitance, the antenna assembly 13 operates as a slot antenna. The capacitor 18 is mounted on the circuit board 5.

In FIG. 4A, an arrow H shows a polarization surface magnetic field of a wave radiated from the slot antenna, and an arrow E shows an electrical field thereof. In FIG. 4A, a property of the radiation pattern of the slot antenna is shown using two solid lines 17, which have perpendicular components relative to the slot 13c and extend in two opposite directions. A radiation center of the wave from the slot antenna is located at the center portion of the slot 13c. As is well known in this art, a property of radiation of a dipole antenna remains the same when the direction of the magnetic field and the direction of the electrical field of the slot antenna are changed relative to each other.

However the present antenna assembly 13 is a magnetic field affecting antenna in addition to being a slot antenna. Therefore, if an earth plate (a grounded plate) 10 is provided near the center of the antenna 13 parallel to the antenna, a property of radiation of the antenna 13 improves as shown in FIG. 4B by solid line 19. Additionally the gain of antenna 13 increases. In the present wrist-mounted-type portable radio apparatus 1, because the circuit board 5 and the reflective plate 6 are arranged at the rear surface side of the antenna assembly 13, and especially at the rear surface side of the electrically conductive plates 4a and 4b, circuit board 5 and reflective plate 6 function as a ground plate 10. Accordingly, the radiation wave from the antenna 13 to the front surface is not blocked by the reflective plate 6 and the circuit board 5. Because the ground plate 10 comprised of the circuit board 5 and the reflective plate 6 has an image effect and acts as a reflector, a gain of directivity of the antenna assembly 13 becomes about twice that of conventional slot antennas. In addition, when the wrist-mounted-type portable radio apparatus is mounted on the user's wrist, the wrist is located under the circuit board 5 and the reflective plate 6. Therefore, the user's wrist can be used as a part of the ground plate 10, namely, by the present wrist-mounted-type portable radio apparatus, a magnetic field around the human body can be used actively.

One of the terminals of the capacitor 18 is connected to a high frequency amplifier circuit 14 and the other terminal thereof is connected to a ground 15. The high frequency amplifier circuit 14 is part of a radio transmitter portion and/or receiver portion 102 of a circuit 100, which is shown in FIG. 5. The circuit 100 has the radio transmit/receive portion 102 connected to the antenna assembly 13, a wave shaping circuit 103, a power control circuit 104 for supplying electric power to the above circuits, and a control circuit 105 for controlling the power control circuit 104. The circuit 100 also has a P-ROM (programmable read only memory) 106 for storing an assigned call number to be referenced by the control circuit 105, a RAM (random access memory) 109 for storing received information that follows the assigned call number, an LCD (liquid crystal display) 112 of a data display portion 3 for displaying information, an LCD driving circuit 110 for controlling LCD 112, and an oscillator circuit 111 for supplying a clock signal for controlling the LCD driving circuit 110. A message processing portion 114 is constituted by the power control circuit 104, the control circuit 105, the RAM 109, the LCD driving circuit 110 and the oscillator circuit 111. The LCD 112 displays the message processed in the message processing portion 114. The circuit 100 also has an alarm generating circuit 107 for announcing that the message is located in memory, an alarm 108 such as a buzzer or an LED, vibrator and the like, and an outer switching portion 113.

Figure 5:
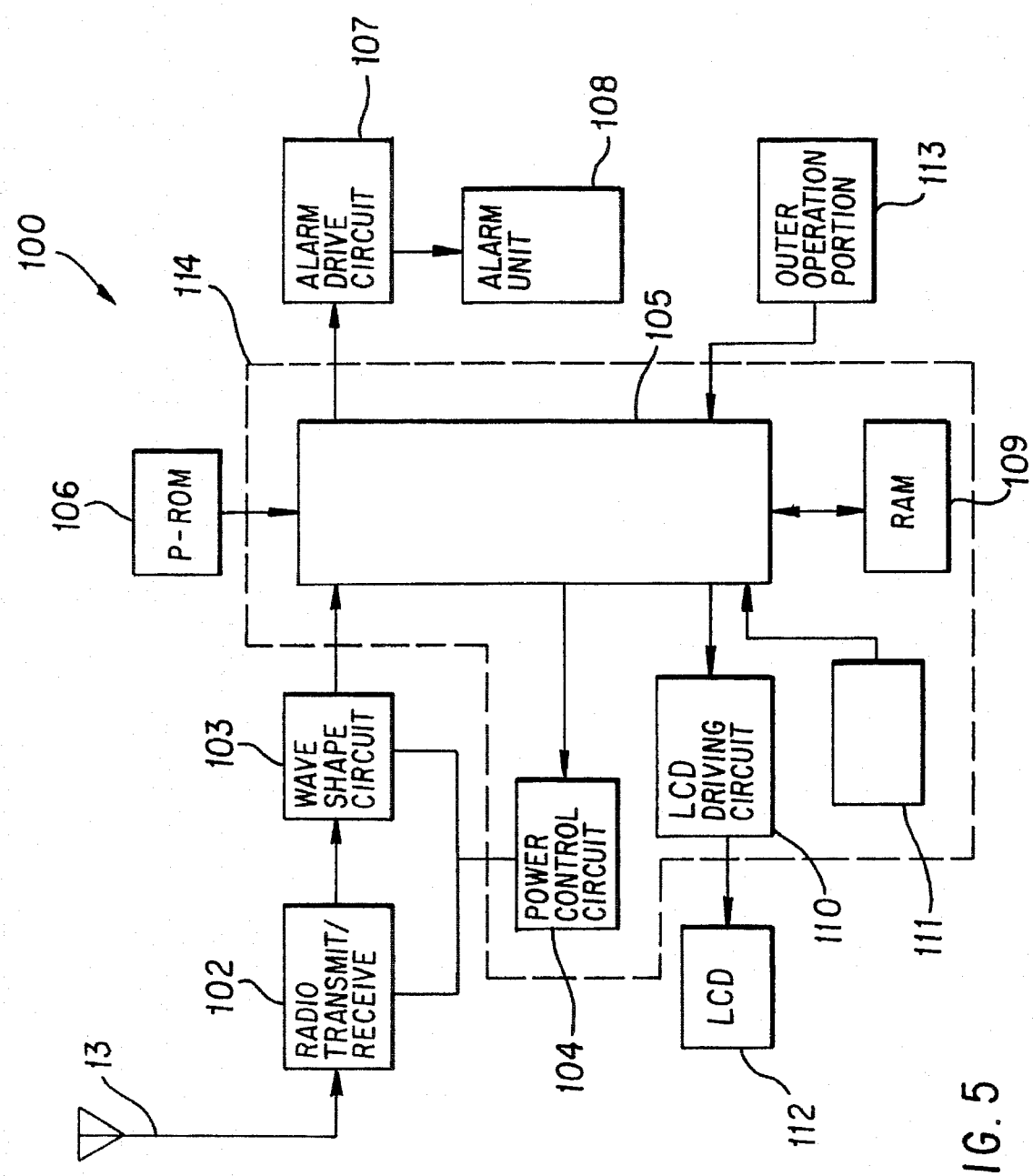
FIG. 5 is a schematic block diagram of circuitry for driving the wrist-mounted-type radio apparatus of FIG. 1A.
Figure 6A:
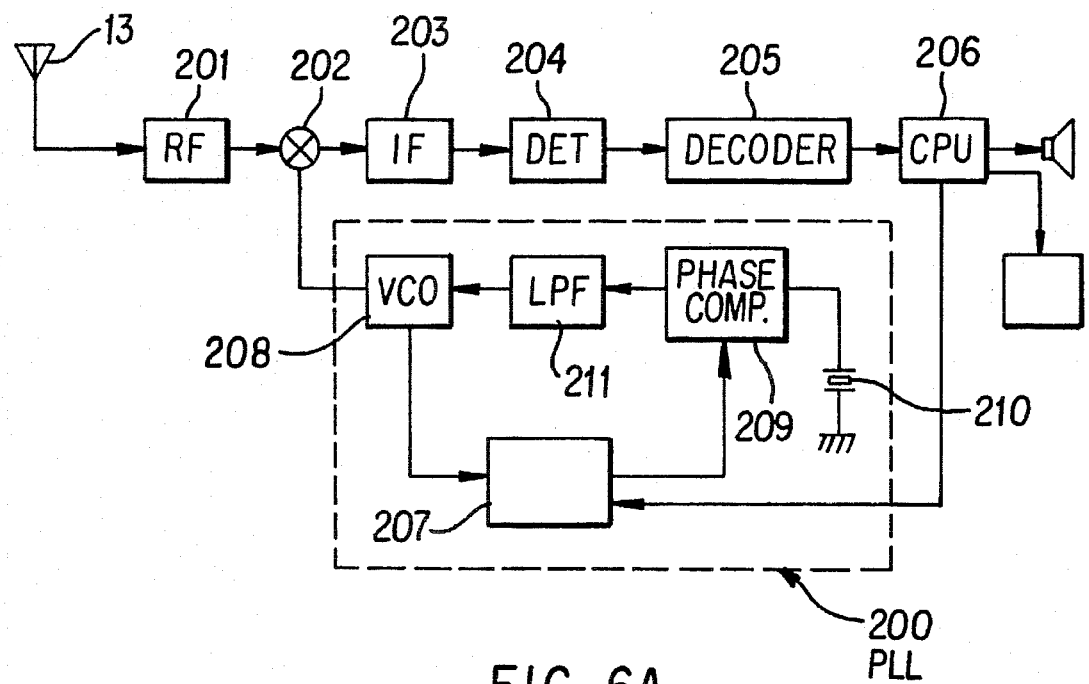
FIG. 6A is a schematic block diagram of radio circuitry of a typical single super-heterodyning type apparatus.

As shown in FIG. 6A, when the radio transmit receive portion 102 uses the single super heterodyning method, it has an RF amplifier 201, which is the high frequency wave amplifier 14, a mixer 202, and an IF amplifier 203, these elements being connected sequentially from the antenna assembly 13. In the radio transmit/receive portion 102, according to a demultiplier rate signal generated from a CPU 206 to a pre-scaler 207 of a PLL (phase-lock-loop) 200 corresponding to a desired frequency, the pre-scaler 207 demultiplies a current frequency in VCO (Voltage Control Oscillator) 208. By this process, for example, the VCO 208 outputs a 51 kHz square wave signal to a phase comparator 209. A reference oscillator 210 connected thereto oscillates constantly to generate, for example 50 kHz. Since there is a 1 kHz deviation between the 51 kHz square wave signal and the reference oscillator 210, the phase comparator 209 generates a square wave signal having a pulse width corresponding to the deviation. A low pass filter 211 connected to the phase comparator 209 converts the signal to a new voltage signal having an almost direct current component. The direct current signal is supplied to the VCO 208 for varying the desired frequency supplied to the mixer 202. According to the above, in the single super heterodyning method, a received high frequency wave signal is mixed by the oscillator output in the mixer 202, and is converted to a middle level frequency signal corresponding to the deviation thereof and then is regenerated as a received signal. The middle level frequency signal generally has a frequency of 455 kHz. The reference oscillator can generate the signal having, for example, 2 to 3 MHz. The wave shape circuit 103 of FIG. 5 is a detector 204 as shown in FIG. 6A. The control portion 105 is constituted by a decoder 205 and the CPU 206.

Figure 6B:
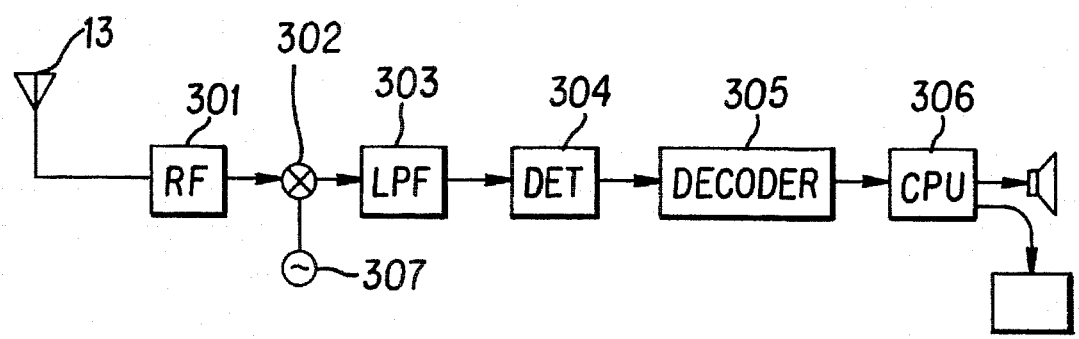
FIG. 6B is a schematic block diagram of radio circuitry of a typical direct-conversion type apparatus.

When the radio transmit/receive portion is a direct conversion method as illustrated in the block diagram of FIG. 6B, it has a RF amplifier 301, which is the high frequency RF (radio frequency) wave amplifier 14, a mixer 302, a low pass filter 303, a detector 304, a decoder 305, and a CPU 306, these elements being connected sequentially from the antenna assembly 13. In the direct conversion method, a received signal is not converted to an intermediate frequency (IF) signal; this is a difference from the single super heterodyning method. Put another way, it can be understood that the intermediate frequency (IF) becomes 0 Hz. Mixer 302 receives the output of RF amplifier 301 and the output of a local oscillator 307, which can be, for example, a quartz crystal oscillator. The low pass filter 303 passes the signal having a base band frequency of 0 to 10 kHz. In the direct conversion method, the circuit frequency is the same as an oscillated frequency from the local oscillator 307, and under such conditions a signal having the base band frequency passes.

The RF amplifiers 201 and 301 shown in FIG. 6A and 6B correspond to the RF amplifier 14 shown in FIG. 20, to be referenced later. An output terminal of the RF amplifiers 201 and 203 corresponds to the terminal 16 shown in FIG. 20.

In FIG. 5, a transmitted signal having some circuit frequency is received via antenna assembly 13 and demodulated at the radio transmit/receive circuit 102, the signal then is converted to a square wave in the wave shape circuit 103. The control circuit 105 and power control circuit 104 supply the electrical power to the wave shape circuit 103 and to the radio transmit/receive portion 102 during a time only when they receive signals. The control circuit 105 generates a battery saving timing signal for controlling such power supply condition and for controlling the power control circuit 104. The control circuit 105 also performs a bit synchronization and a frame synchronization using the received signal. In addition, in the control circuit 105, the assigned call number stored in the P-ROM 106 is compared with the received signal supplied from the wave shaping circuit 103 with error correction so as to determine whether the assigned call number has been received. The control circuit 105 also has a counting function for generating the signal using oscillator circuit 111 comprised of a reference signal source such as a quartz crystal oscillator.

After the call is confirmed, message data, which follows the assigned call number, is received and is stored in the RAM 109. The alarm device 108 announces receipt of the message to the user under the control of the alarm driving circuit 107. According to a control at the outer operating portion 113, which is comprised of a switch and the like, the message stored in the RAM 109 is supplied to the LCD driving circuit 110 via the control circuit 105. For example, upon hearing the buzzer, the user presses a button so that the message is displayed. The LCD driving circuit 110 displays the message on the LCD 112 using the clock signal supplied by the oscillator circuit 111.

Figure 7:
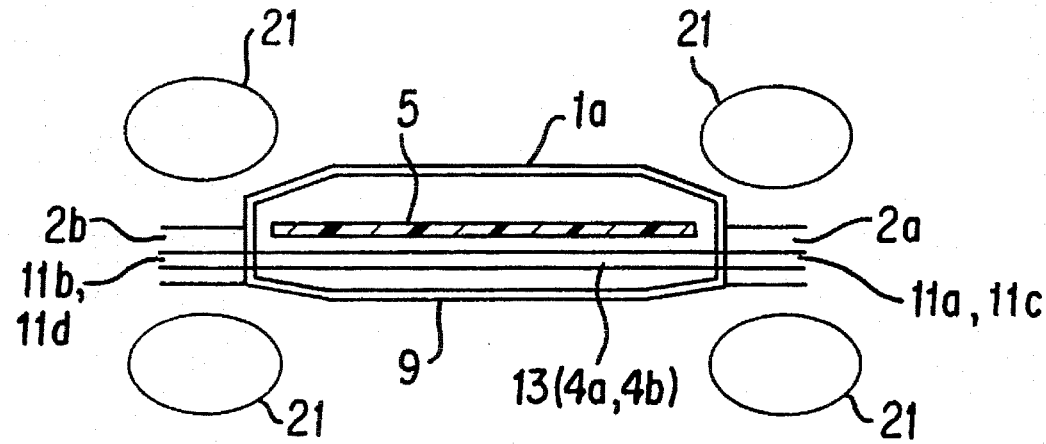
FIG. 7 illustrates a typical directivity of a wrist-mounted-type radio apparatus having a slot antenna.

In the wrist-mounted-type portable radio apparatus, because the antenna assembly 13 has a power supply point at its center, a part having the maximum radiation wave energy (i.e., the power supply point) is located in the narrow main body 1a. In the main body 1a, there is arranged many other components made from materials such as insulated material, dielectric material, attenuation material, and electrically conductive material. These materials are located, for example, in the circuit board 5. Therefore, when the circuit board 5 and the like are disposed in the radiating path of the wave radiated from the antenna assembly 13, as in conventional radio apparatus, its radiation pattern is divided into four parts, as is shown in FIG. 7 by solid line 21, and its sensitivity is rather poor.

Figure 8:
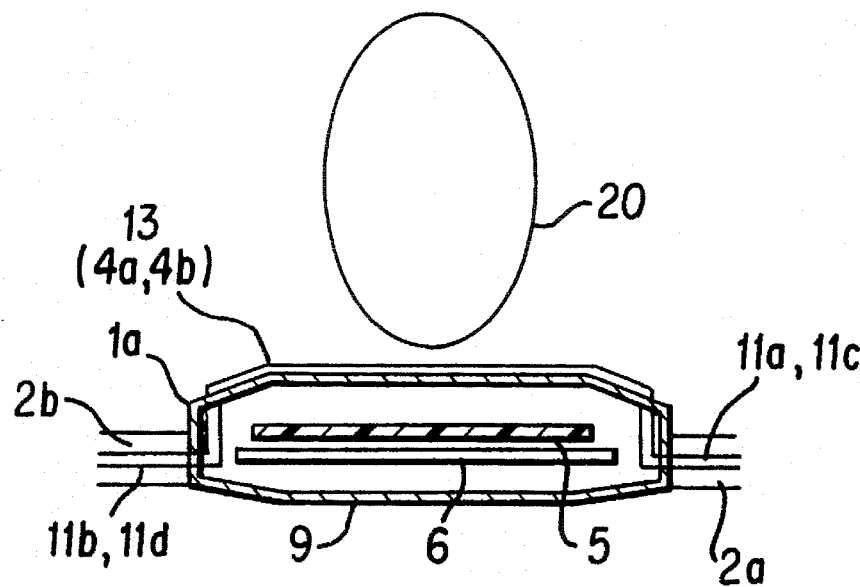
FIG. 8 illustrates a directivity of an antenna of the wrist-mounted-type portable radio apparatus of FIG. 1A.

In the present wrist-mounted-type portable radio apparatus, as shown in FIG. 8, the circuit board 5 is disposed on the rear side of the antenna assembly 13 so that circuit board 5 does not block the wave radiation from antenna assembly 13. Therefore, the radiation energy of the wave is not shielded or lost. The circuit board 5 and the reflective plate 6 disposed on the rear side of the antenna assembly have the effect of upgrading the directivity. Accordingly, the radiation pattern of the present wrist-mounted-type portable radio apparatus has a high directivity towards the front surface side of the main body 1a as is shown by solid line 20 in FIG. 8. The circuit board 5 and the reflective plate 6 disposed on the rear side of the antenna assembly can shield the affect from the human body so that the impedance matching between the radio transmit/receive portion and the antenna portion does not deviate.

Second Embodiment

In the first embodiment, in order to locate the circuit board 5 on the rear side of the electrically conductive plates 4a and 4b, these plates 4a and 4b were disposed between the circuit board 5 and the display portion 3.

Figure 9:
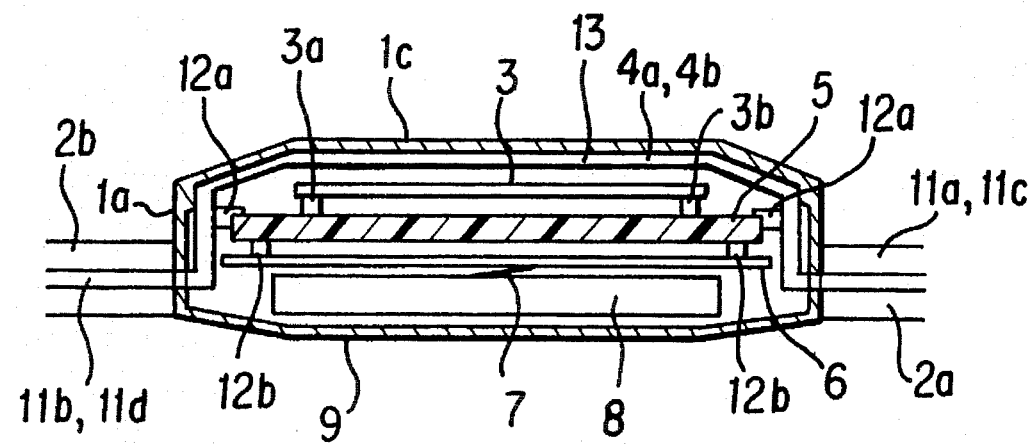
FIG. 9 is a schematic cross-sectional view of a wrist-mounted-type portable radio apparatus according to a second embodiment of the present invention.

In the second embodiment, as is shown in FIG. 9, the electrically conductive plates 4a and 4b are disposed on the front side of the data displaying device 3 so that these plates 4a and 4b are located on the rear surface of the case 1c composing the front surface 1A of the main body 1a.

Figure 10:
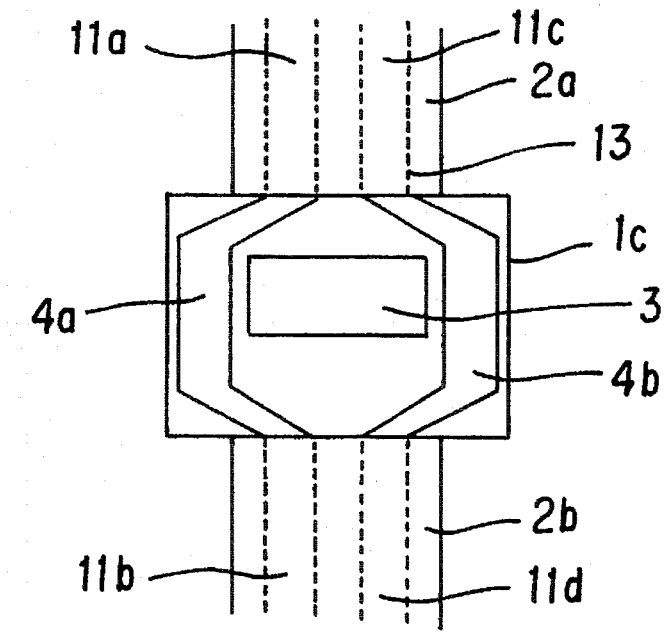
FIG. 10 illustrates the arrangement of a slot antenna in a main body of the radio apparatus of FIG. 9.

In order to keep an open area over the data displaying device 3, as is shown in FIG. 10, the electrically conductive plates 4a and 4b are arranged generally along the side edges of the data displaying device 3, and are disposed on the outer side of the displaying device 3. Therefore, neither circuit board 5 nor data displaying device 6 are arranged on the front surface side of the antenna assembly 13. Accordingly, there is no loss affecting the radiation wave from either of these components so that the radiation energy level can remain high.

Figure 11A:
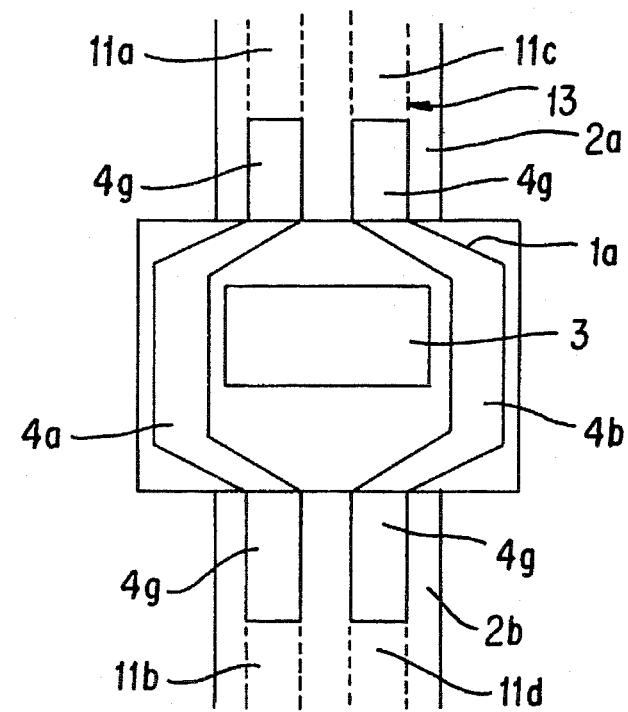
FIG. 11A illustrates another arrangement of a slot antenna in a main body of the radio apparatus of FIG. 9.

The electrically conductive plates 4a and 4b in the main body 1a can be connected to the antenna elements 11a to 11d in the wrist band 2a and 2b around the periphery of the main body 1a. Also, an antenna assembly can be used in which the electrically conductive plates 4a and 4b with the antenna elements 11a to 11d are integrated in the wrist bands. As is shown in FIG. 11A, the antenna elements 11a to 11d can be connected to projected terminals 4g of the electrically conductive plates 4a and 4b, which project from the main body 1a into the wrist band 2a and 2b.

Figure 11B:
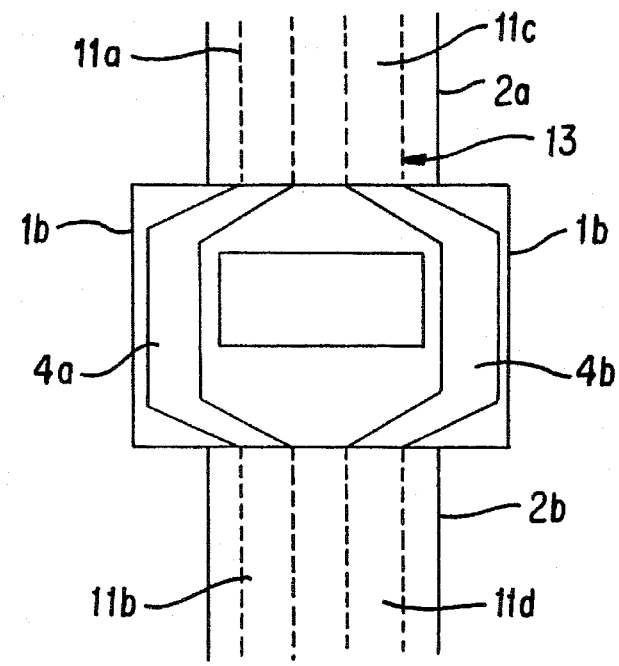
FIG. 11B illustrates still another arrangement of a slot antenna in a main body of the radio apparatus of FIG. 9.

As is shown in FIG. 11B, when the main body 1a has an outer frame 1b, an integrated plate containing the electrically conductive plates 4a and 4b can be installed along the inner side of the outer frame 1b.

Third Embodiment

Figure 12:
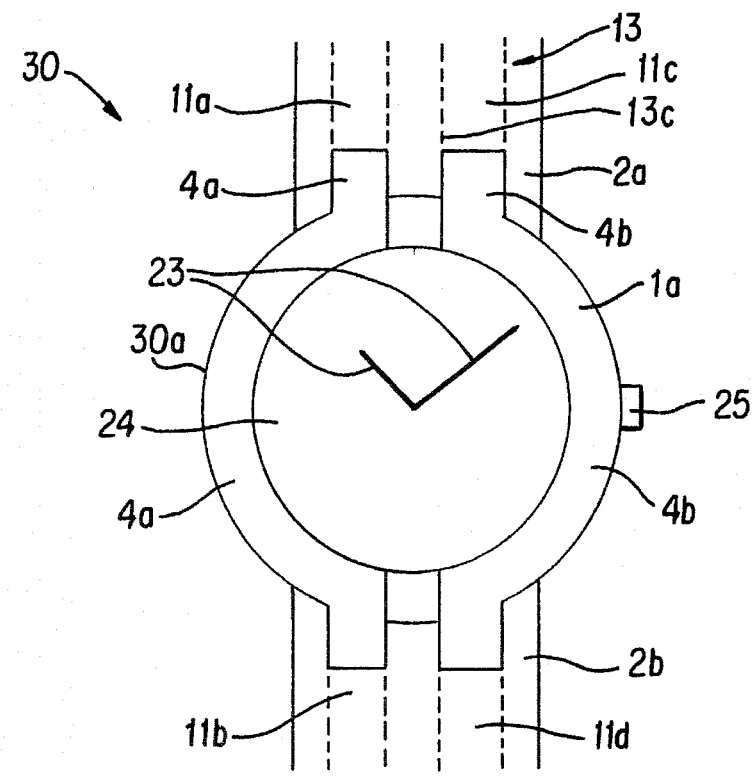
FIG. 12 is a partial plan view of a wrist-mounted-type portable radio apparatus according to a third embodiment of the present invention.

In FIG. 12, the plan view of a main body of a third embodiment of the wrist-mounted-type portable radio apparatus 30 is shown. The basic construction of the wrist-mounted-type portable radio apparatus 30 including that of the other embodiments (4th–18th embodiments) explained hereinafter is generally the same as that of the first embodiment. Therefore the same reference numerals will be applied to the elements having the same function so as to focus further explanation on the differences between each embodiment.

The wrist-mounted-type portable radio apparatus 30 has a main body 1a containing an analog clock having needles. The main body 1a has needles 23 showing the time, a number plate 24 (dial), a crown 25, and the electrically conductive plates 4a and 4b disposed on the front surface side (bezel portion) of the outer frame 30a of the number plate 24. The electrically conductive plates 4a and 4b are electrically connected to the antenna elements 11a to 11d in there respective wrist bands 2a and 2b. The antenna assembly 13, which is a slot antenna having the slot 13c, is constituted by the electrically conductive plates 4a, 4b, and antenna elements 11a to 11d.

In the above wrist-mounted-type portable radio apparatus 30, the electrically conductive plates 4a and 4b are arranged on the front surface side 1A of the main body 1a. The number plate 24 is made of a non-metallic material so that the radiation wave from the electrically conductive plates 4a and 4b is not shielded thereby. The electrically conductive plates 4a and 4b are disposed at the front surface side (the number plate side) of the main body 1a with respect to the circuit board 5 disposed in the main body 1a. According to the arrangement of the present portable radio apparatus 30, the power feeding point to the antenna assembly 13, which has the maximum radiation energy, is the center of the longer side of the assembly 13, which is located on the electrically conductive plates 4a and 4b. Since the radiation from the electrically conductive plates is not shielded, the energy of the radiation wave can be maintained at a high level. The circuit board 5 and the other parts arranged on the rear side of the antenna assembly 13 act as a reflector so that the directivity of the present antenna assembly is upgraded. The circuit board 5 and the other parts also can shield the affect of the human body, so that the impedance matching between the radio transmit/receive portion and the antenna assembly does not deviate.

Fourth Embodiment

Figure 13:
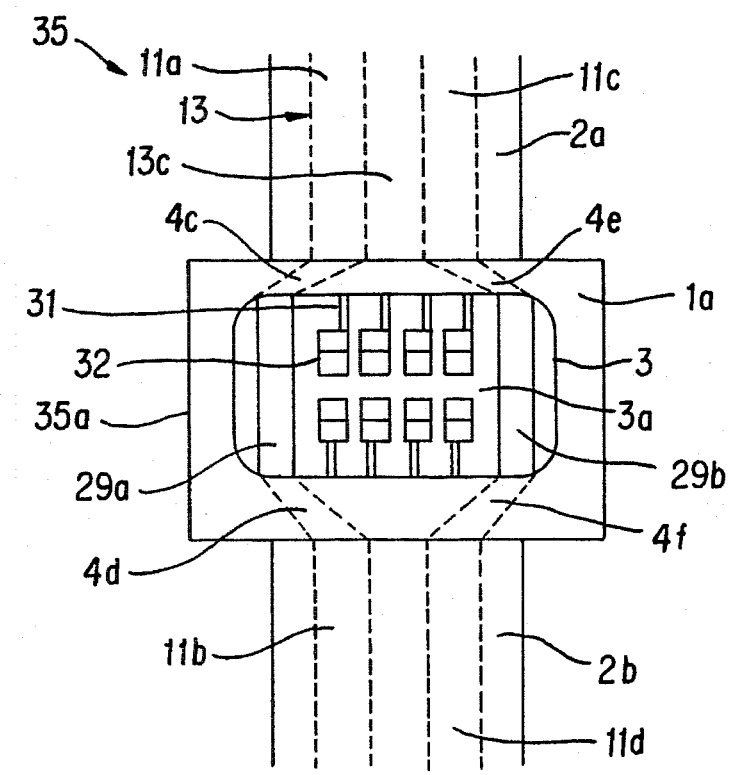
FIG. 13 is a partial plan view of a wrist-mounted-type portable radio apparatus according to a fourth embodiment of the present invention.

In FIG. 13, the plan view of a main body of a wrist-mounted-type portable radio apparatus 35 according to a fourth embodiment is shown.

In the wrist-mounted-type portable radio apparatus 35, the main body 1a has outer frame 35a on which electrically conductive plates 4c to 4f are provided. Two rows (an array) of thin film conductive patterns 29a and 29b also are provided on a display surface 3a of the data displaying device 3 in order to form a part of the antenna assembly 13 in the main body 1a. The electrically conductive plates 4c to 4f are electrically connected to corresponding ones of the conductive patterns 29a and 29b to form paths through main body 1a. The antenna assembly 13, which is a slot antenna having the slot 13c, is constituted by the conductive patterns 29a and 29b, the electrically conductive plates 4c to 4f, and antenna elements 11a to 11d. On the surface of the data displaying device 3, in addition to the conductive patterns 29a and 29b, segment electrodes 32 and the circuit patterns 31 for applying a driving voltage to segment electrodes 32 are arranged.

Since the display surface 3a of the displaying unit 3 is positioned on the front surface of the main body 1a, the conductive patterns 29a and 29b are also positioned on the front surface of the main body 1a. Hence, the circuit board 5 and other components in the main body 1a are arranged on the rear side of the conductive patterns 29a and 29b. The conductive patterns 29a and 29b can be made from a thin film that is optically transparent. Therefore, if these patterns cover a large area of the data displaying unit 3, the function for the data indication is not affected.

In the wrist-mounted-type portable radio apparatus 35, the electrical feeding point to the antenna assembly 13 is located on the conductive patterns 29a and 29b, and is arranged at a center portion of the antenna assembly 13. Since the portion having the maximum radiation energy of the wave is disposed on the front surface of the main body 1a the wrist-mounted-type portable radio apparatus 35 also maintains the radiation energy at a high level. In addition, the image effect (reflectivity) of the circuit board 5 disposed at the rear side of the antenna assembly 13 upgrades its directivity. The effect from the human body can be shielded according to the same process of the first embodiment so that the impedance matching between the radio transmit/receive portion and the antenna assembly of the wrist-mounted-type portable radio apparatus does not deviate when it is mounted on a user's wrist.

The conductive patterns 29a and 20b can be arranged on the top layer of a multi layer circuit pattern disposed on the data displaying unit 3. The conductive pattern 29a and 29b also can be arranged as a middle layer or as a lower layer thereof.

Fifth Embodiment

Figure 14A:
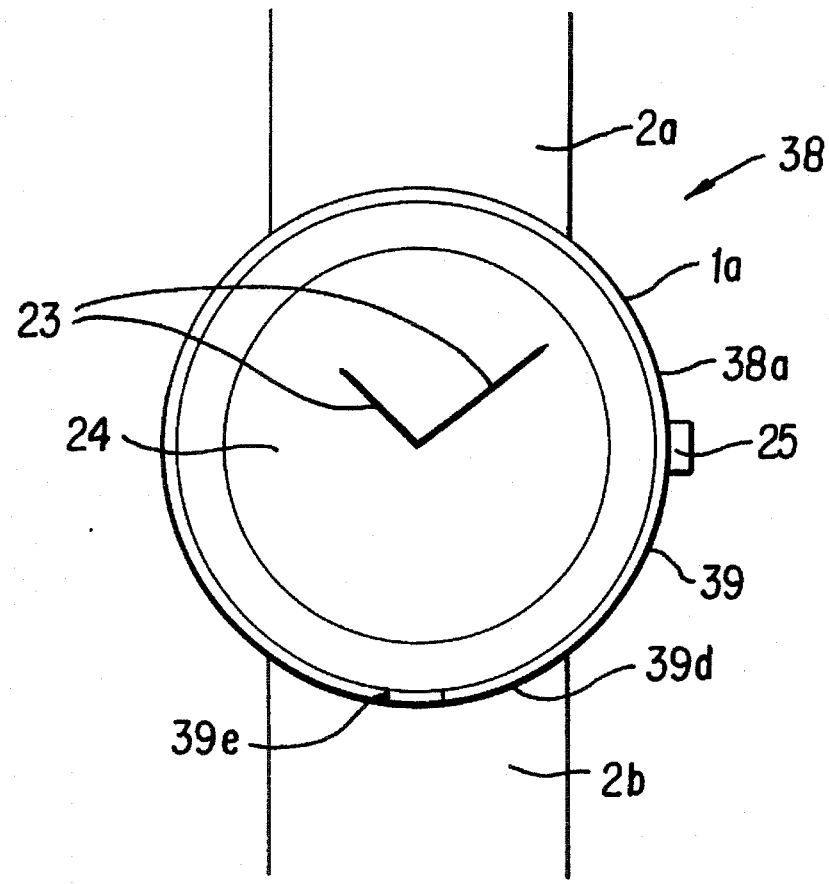
FIGS. 14A and 14B are a partial plan view and a partial side view of a wrist-mounted-type portable radio apparatus according to a fifth embodiment of the present invention.
Figure 14B:
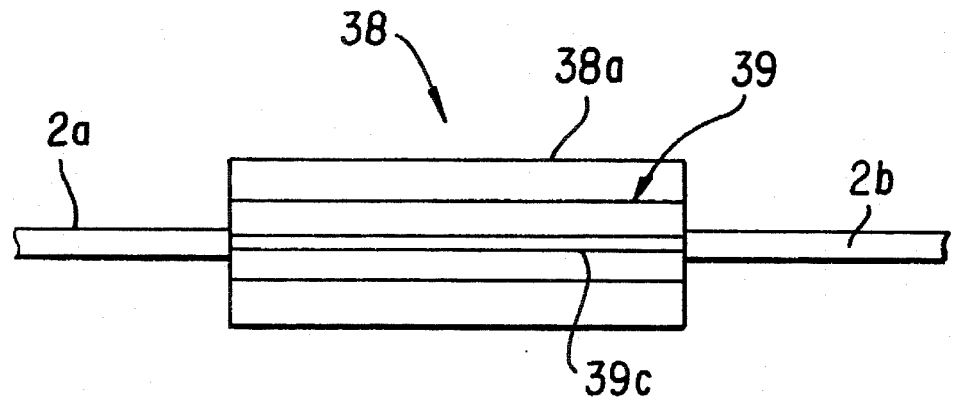

In FIG. 14A, the plan view of a main body of a wrist-mounted-type portable radio apparatus 38 of the fifth embodiment is shown. FIG. 14B shows a sectional view.

The main body 1a of the wrist-mounted-type portable radio apparatus 38 is a needle type clock or watch and has needles 23 for indicating the time, a number plate 24, a crown 25, and an antenna assembly 39 arranged on the outer surface of an outer frame 38a of the number plate 24.

The antenna assembly 39 is, as shown in FIG. 14B, a slot antenna having a slot 39c facing to the outer surface from the outer frame 38a. Wrist bands 2a and 2b, which connect to the main body 1a do not have any antenna elements. Both ends 39d and 39e of the antenna assembly 39 are located on the side of the outer frame 38a adjacent to band 2b, with the assembly 39 extending around the periphery of the outer frame 38a.

In the wrist-mounted-type portable radio apparatus 38, the antenna assembly 39 is arranged on the outside around the side surface of the main body 1a. Therefore nothing is located outside of the antenna assembly 39 for shielding the wave generated therefrom. The power feeding point to the antenna assembly 39 is located at the center along the longer edge of the slot, the center being disposed on the side near band 2a. Nothing is arranged on the power feeding point for shielding the wave generated from the feeding point. Therefore, according to the wrist-mounted-type portable radio apparatus 38, the radiation energy of the wave is not attenuated. The image effect of the circuit board arranged in the main body 1a and the outer frame 38 itself upgrades the sensitivity.

Sixth Embodiment

Figure 15:
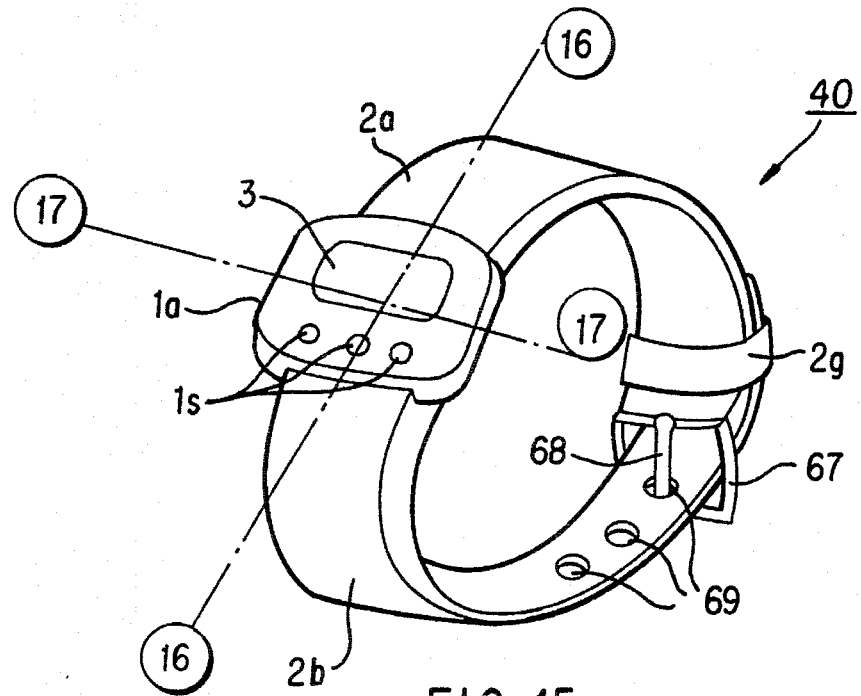
FIG. 15 is a perspective view of a wrist-mounted-type portable radio apparatus according to a sixth embodiment of the present invention.
Figure 16:
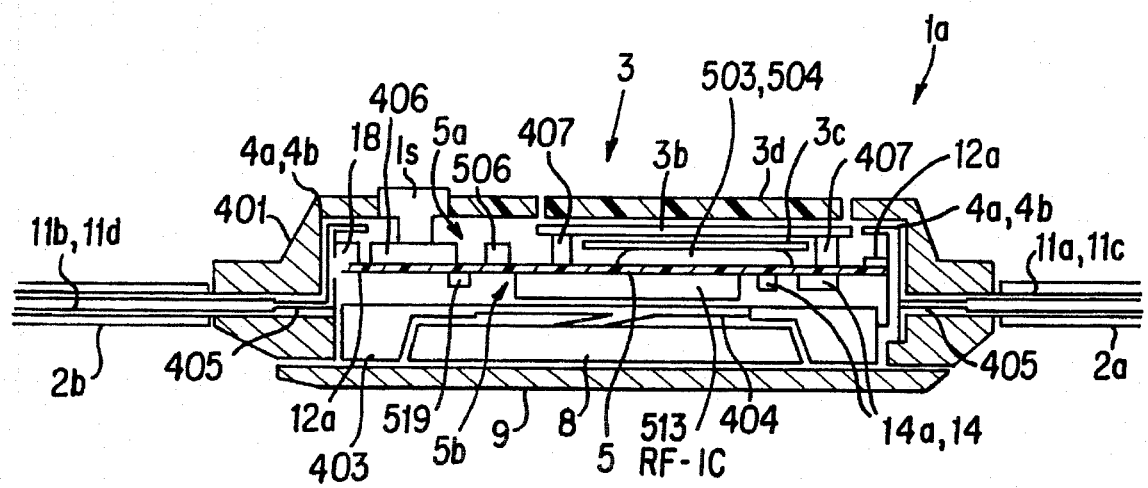
FIG. 16 is a schematic sectional view taken along line 16—16 of FIG. 15.
Figure 17:
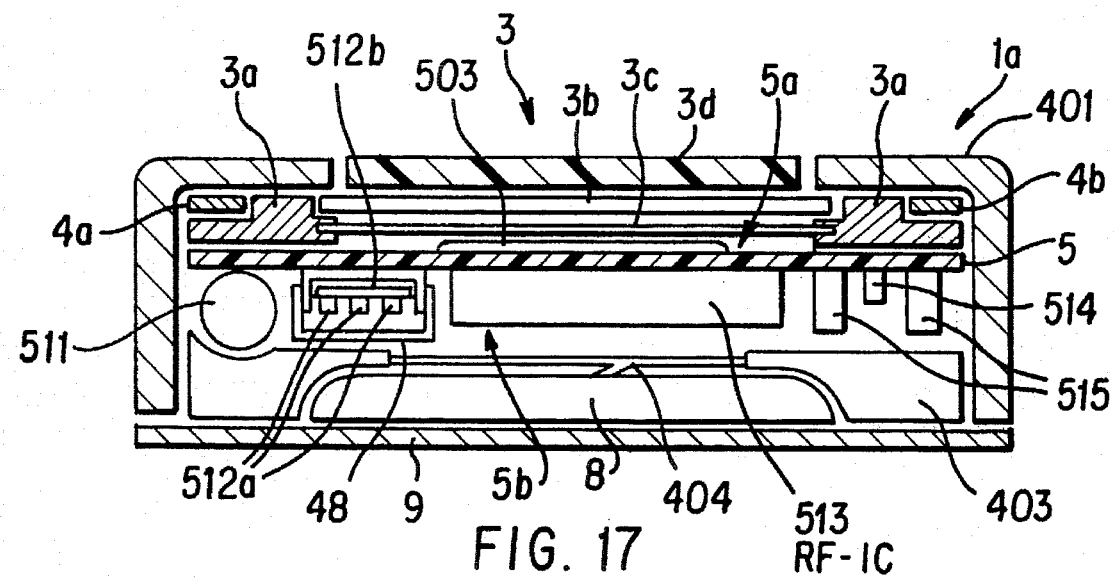
FIG. 17 is a schematic sectional view taken along line 17—17 of FIG. 15.

FIG. 15 is a perspective view of an outline of a wrist-mounted-type portable radio apparatus 40 according to a sixth embodiment. FIG. 16 is a sectional view taken along line 16—16 of FIG. 15. FIG. 17 is a sectional view taken along line 17—17 of FIG. 15.

The wrist-mounted-type portable radio apparatus 40 has wrist bands 2a and 2b connecting to the main body 1a thereof for mounting it on a user's wrist. The data displaying device 3 and one or more switches 1s are disposed on the front surface of the main body 1a. The wrist band 2a has a clasp 67 at its distal end, which functions as a connecting means of wrist bands 2a and 2b. The wrist band 2b has plural joining holes 69 into which a lock pin 68 can be inserted. The wrist band 2a also has a band holder 2g for holding a residual part of the wrist band 2b.

The above connection mechanism is a popular one in the art used for a wrist watch. However, the conventional wrist-mounted-type portable radio apparatus having a loop antenna cannot have the above mechanism because distal ends of wrist bands must be electrically connected with each other to form the loop antenna (i.e., the clasp must form an electrical connection between the antenna portions in each band). On the other hand, since the present wrist-mounted-type portable radio apparatus has the slot antenna in its wrist band that does not require the clasp to be used to connect the antenna portions, the above popular mechanism for connection of the wrist bands can be applied thereto.

In the conventional wrist-mounted-type portable radio apparatus having the loop antenna, since the distal end of the wrist bands are mechanically connected by the clasp to each other to form the loop antenna, static electricity is transferred to the main body from the clasp portion. Therefore, some countermeasure is required for protection from the affects of the static electricity. However, since the present wrist-mounted-type portable radio apparatus has the clasp 67 installed at the distal end of the wrist band, which clasp is electrically insulated from the antenna assembly 13, no countermeasure for the static electricity is required. Therefore, the present wrist-mounted-type portable radio apparatus can be designed using a popular clasp for the wrist watch.

The wrist band 2a and 2b has, as shown in FIG. 16, the antenna elements 11a to 11d therein. The antenna elements 11a and 11b are connected to the electrically conductive plate 4a disposed in the main body 1a. The antenna elements 11c and 11d are connected to the electrically conductive plate 4b disposed in the main body 1a. The detailed construction will be explained hereafter.

As is shown in FIG. 16 and FIG. 17, the main body 1a has a case 401, the circuit board 5 horizontally disposed in the case 401, an electrically conductive rubber member 406 disposed on the circuit board 5, and the switch 1s connected to the circuit board 5 via the conductive rubber member 406. The main body 1a also has a panel frame 3a on the front side of the circuit board 5, the data displaying unit 3 disposed between the panel frame 3a and the circuit board 5. The displaying unit 3 has a panel 3b electrically connecting to the circuit board 5 via an electrically conductive rubber member 407. The main body 1a has a protective lens 3d disposed on the front surface side of the panel 3b, and an optical reflective plate 3c for the panel 3b located between the panel 3b and the circuit board 5.

On the front surface side of the circuit board 5, the electrically conductive plates 4a and 4b are arranged. Ends of conductive plates 4a, 4b are electrically connected to the edges of the antenna elements 11a to 11d via connecting pins 405, which penetrate the case 401. The electrically conductive plates 4a and 4b are connected to the front surface side of the circuit board 5 via terminal board 12a. In FIG. 16 and FIG. 17, a part of the electrically conductive plates 4a and 4b are shown. The electrically conductive plates 4a and 4b are arranged along the internal surface of case 401 to connect the antenna elements 11a and 11b, and the antenna elements 11c and 11d respectively. A part of the electrically conductive plates 4a, 4b are shown at the upper corner to the panel frame 3a in FIG. 17.

In the main body 1a, a battery 8 is installed in a battery case 403 disposed on the rear surface side of the circuit board 5. The negative side of the battery 8 is connected to the ground (earth) pattern of the circuit board via an electrode 404. The main body also has a rear case 9 arranged on the rear surface side of the case 401 for closing it.

In order to realize the radio transmit/receive portion 102 shown in FIG. 5 or FIG. 6, the circuit board 5 has a decoder 503, a CPU 504, a digital circuit part 506 and other elements on the front surface side thereof to define a digital circuit 5a. The circuit board 5 has, in order to realize the high frequency amplifier circuit 14 (RF amplifier), a circuit element 14a, a RF-IC 513, analog circuit parts 519 and other elements disposed on the rear surface side thereof. As shown in FIG. 17, the circuit board 5 has, in order to realize an analog circuit 5b, a chip capacitor 514, a tantalum capacitor 515, the RF-IC 513, a local oscillator element 512a covered with shield case 48 and the like on the rear surface side thereof. The local oscillator 512a is arranged on a circuit board 512b. The arrangements of the above parts are explained hereunder.

Figure 18:
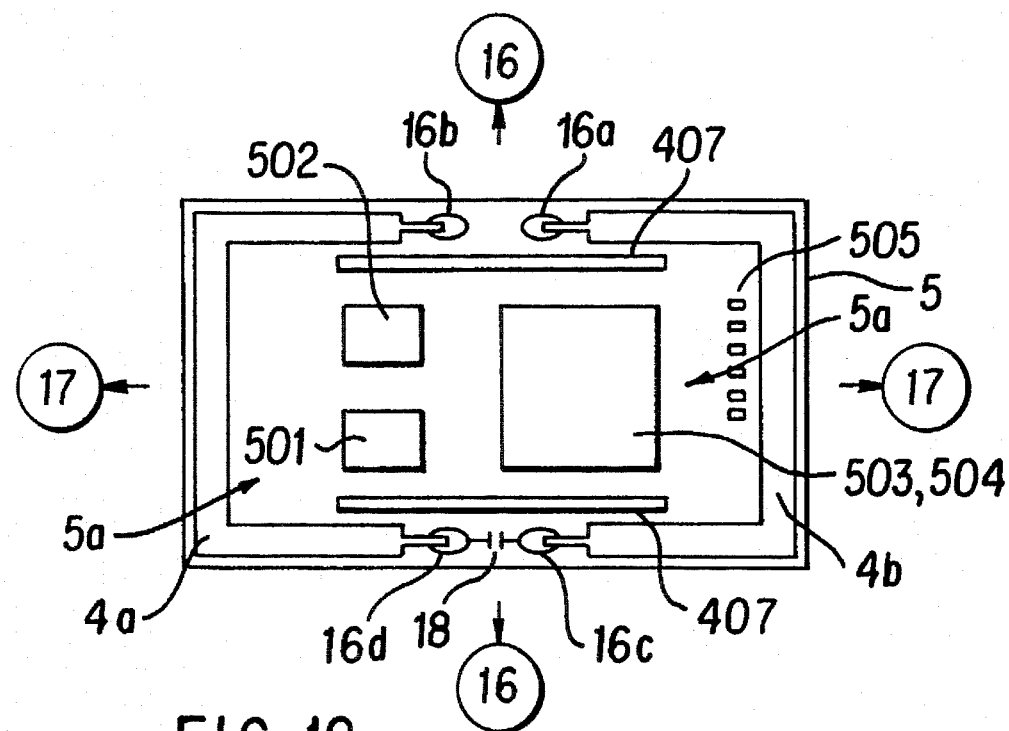
FIG. 18 illustrates a layout of circuit portions arranged on the upper surface of a circuit board assembly of the wrist-mounted-type portable radio apparatus of FIG. 15.
Figure 19:
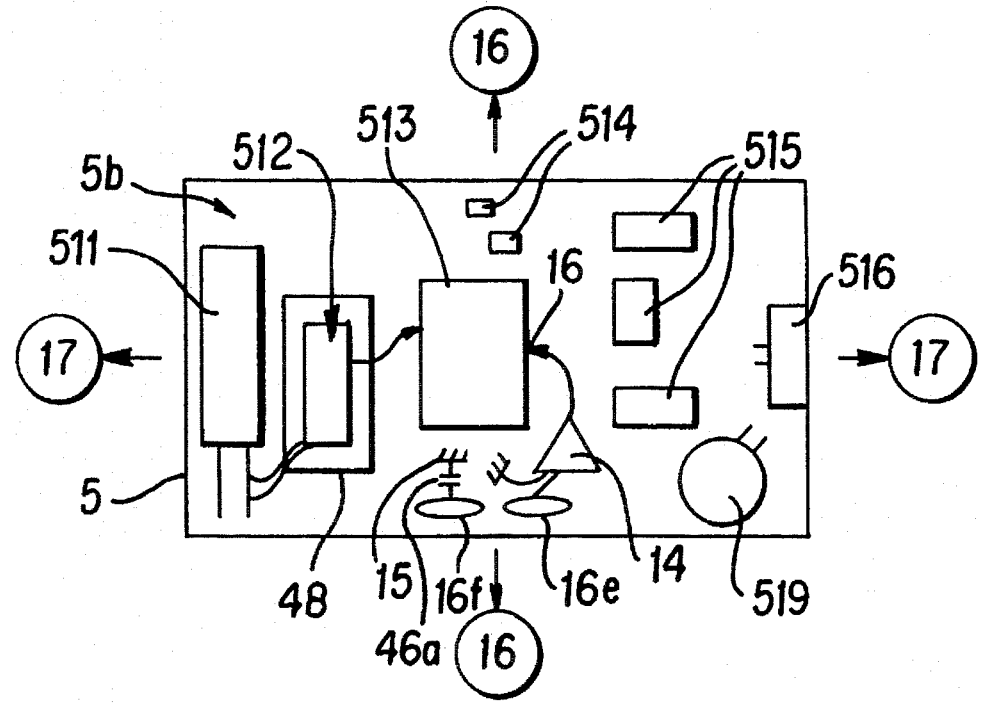
FIG. 19 illustrates a layout of circuit portions arranged on the lower surface of the circuit board assembly of the wrist-mounted-type portable radio apparatus of FIG. 15.

FIG. 18 is a schematic plan view showing the arrangement of the front surface side of the circuit board 5. FIG. 19 is a schematic plan view showing the arrangement of the rear surface side of the circuit board 5.

As shown in FIG. 18, on the front surface side of the circuit board 5, the electrically conductive plates 4a and 4b are arranged along the outer edge thereof. The edge of the electrically conductive plates 4a and 4b are connected to the circuit board 5 at terminal points 16a to 16d. A capacitor 18 is connected between terminal points 16c and 16d. On the front surface side of the circuit board 5, for constructing the digital circuit 5a, there are arranged the chip capacitor 505, decoder 503, CPU 504, DC-DC converter 501, EEPROM 502 and other elements. In the digital circuit 5a, all of following circuits for processing digital data are provided: a data decoding circuit, a central processing circuit (CPU), a data storage circuit (memory), a data displaying circuit, a phase controlling circuit, and a phase comparing circuit. On the same side of the circuit board 5, terminals 407 for panel driving of the data displaying unit 3 are arranged. The DC-DC converter 501 is located on the left side of the circuit board 5 closer to the electrically conductive plate 4a than to the plate 4b.

On the rear surface side of the circuit board 5, as shown in FIG. 19, for constructing the analog circuit 5b, there are arranged the tantalum capacitors 515, the high frequency wave amplifier 14, the chip capacitors 514, the RF-IC 513, the local oscillator 512 covered with shield case 48, and a quartz crystal oscillator 511. The local oscillator 512 and the quartz crystal oscillator 511 are disposed on the left side of the circuit board 5. On the rear surface side of the circuit board 5, there also are arranged a terminal point 16e for the high frequency wave amplifier 14, and a terminal point 16f connected to the ground 15 via a capacitor 46a. The high frequency wave amplifier output 16 is connected to the RF-IC 513. Since the terminal point 16e is connected to the terminal point 16a located on the front surface side of the circuit board 5 via a through hole, the high frequency wave amplifier 14 is connected electrically to the electrically conductive plate 4b. Since the terminal point 16f is connected to the terminal point 16b located on the front surface side of the circuit board 5 via a through hole, the ground potential is supplied to the electrically conductive plate 4a. On the rear surface side of the circuit board 5, a buzzer 516 and a battery backup capacitor 519 also are provided.

Figure 20:
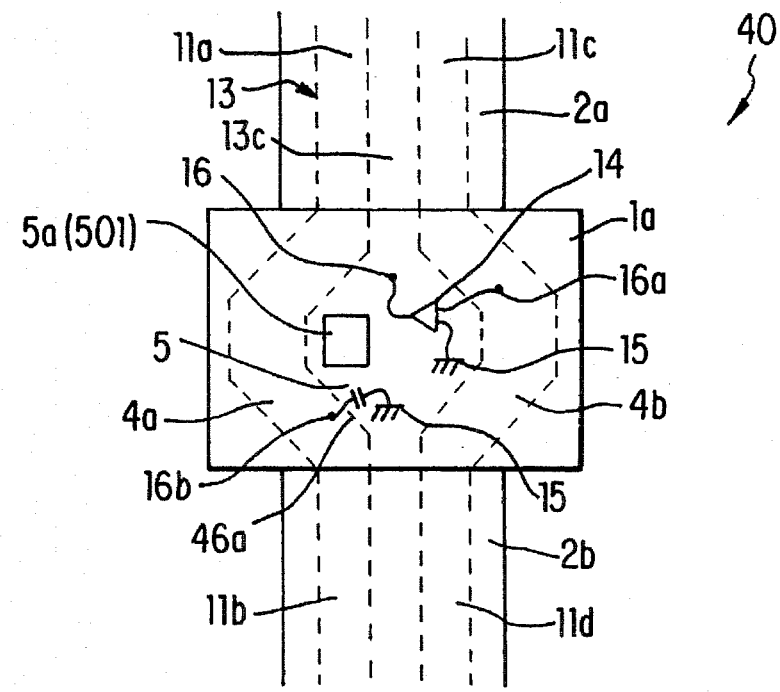
FIG. 20 shows structural characteristics in section of the wrist-mounted-type portable radio apparatus of FIG. 15.

In FIG. 20, the pertinent features of the wrist-mounted-type portable radio apparatus 40 are shown. In the wrist-mounted-type portable radio apparatus 40, the antenna assembly 13, which is a slot antenna having the slot 13c, is comprised of the antenna elements 11a to 11d fixed in the pair of bands 2a and 2b, and the electrically conductive plates 4a and 4b arranged in the main body 1a and connected to the antenna elements 11a to 11d respectively, the slot 13c being located between the pair of above members. The electrically conductive plate 4a is connected via the terminal point 16b to the ground 15 of the circuit board 5. The electrically conductive plate 4b is connected via the terminal point 16a to the high frequency wave amplifier 14. Hence the high frequency wave amplifier 14 is connected to the electrically conductive plate 4a through the ground 15 of the circuit board 5. Therefore, the voltage of the electrically conductive plates 4a and 4b is unbalanced, and these plates 4a and 4b have different voltage levels.

In the digital circuit 5a, since the DC-DC converter 501 might be a noise source, it is located near the electrically conductive plate 4a. In the analog circuit 5b, the quartz crystal oscillator 511 having a natural frequency of 90 MHz in this embodiment, and the local oscillator 512, both might be noise sources, and are disposed near the electrically conductive plate 4a. Therefore, the electrically conductive plate 4b is located rather far from the noise sources such as the quartz crystal oscillator 511, the local oscillator 512 and the DC-DC converter 501. Accordingly, in the above arrangement, even if noise is generated from the local oscillator 512, the DC-DC converter 501 and the like, the electrically conductive plate 4a is not affected by such noise, because the plate 4a has the low impedance at the high frequency wave band due to the connection to the ground 15. The electrically conductive plate 4b has a high impedance at the high frequency band. However, the plate 4b is not affected by the noise generated due to its location far from the noise sources.

In the portable apparatus such as a radio, TV, receiver, pager, etc. adopting the direct conversion detecting method such as the direct conversion circuit and the like, the locally oscillated frequency is substantially equal to that of the receiving frequency. Therefore, the antenna assembly 13 tends to catch its local oscillation signal as noise that interferes with the transmitting and receiving among the portable radio apparatus.

In the wrist-mounted-type portable radio apparatus 40, the local oscillator 512 is disposed, along with the DC-DC converter 501, in the digital circuit 5a near the electrically conductive plate 4a having the low impedance at the high frequency band, and far from the electrically conductive plate 4b having the high impedance at the high frequency band. Therefore, the noise generated from the local oscillator 512 does not radiate outwardly.

In addition to the DC-DC converter 501 and the local oscillator 512, the message processing portion 114, P-ROM 106, the alarm driving circuit 107 and the other some circuits among the circuit 100 shown in FIG. 5 might be a noise source. Therefore, these circuits may be disposed far from the electrically conductive plate 4b having the high impedance at the high frequency band so that the noise does not have an adverse affect.

Figure 21:
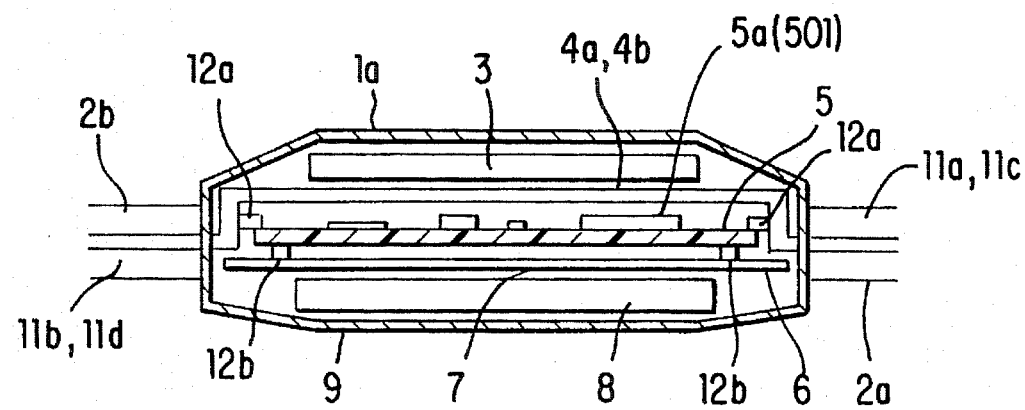
FIG. 21 shows structural characteristics in cross section of the wrist-mounted-type portable radio apparatus of FIG. 15.

In FIG. 21, the typical points of the wrist-mounted-type portable radio apparatus 40 are shown using a sectional view. The main body 1a has, as in the first embodiment, the circuit board 5 containing the high frequency ground pattern thereon disposed on the rear surface side of the electrically conductive plates 4a and 4b and acts as a reflector. When the wrist-mounted-type portable radio apparatus 40 is mounted on a user's wrist, the rear case 9 thereof is contacted with the user's wrist. However, the antenna assembly 13 of the wrist-mounted-type portable radio apparatus 40 is shielded by the rear case 9 and the reflective plate 6 from the wrist, and can prevent adverse affects of the human body.

Seventh Embodiment

Figure 22A:
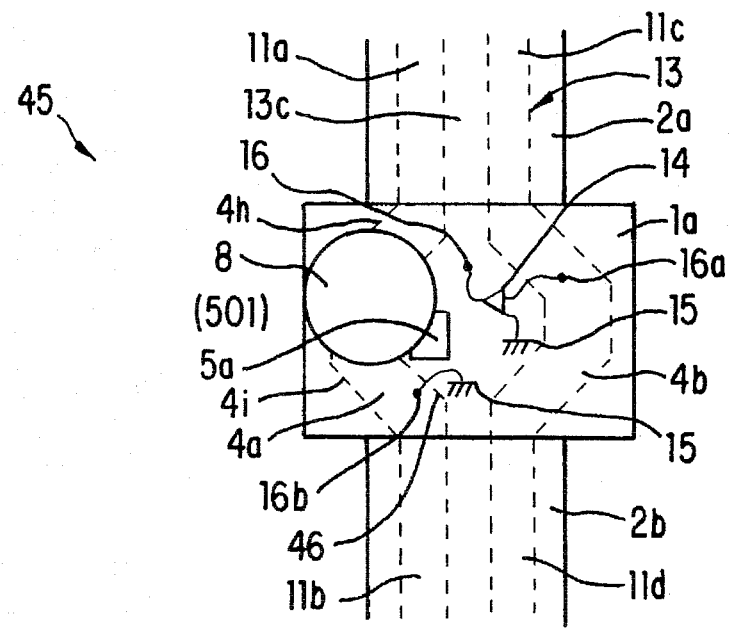
FIG. 22A illustrates a layout of respective portions of a wrist-mounted-type portable radio apparatus according to a seventh embodiment of the present invention.

FIG. 22A shows a partial plan view of a wrist-mounted-type portable radio apparatus 45 according to a seventh embodiment of the invention.

As in the wrist-mounted-type portable radio apparatus 1 of the first embodiment, the wrist-mounted-type portable radio apparatus 45 has the antenna assembly 13, which is a slot antenna having the slot 13c, comprised of the antenna elements 11a to 11d fixed in the pair of wrist bands 2a and 2b arranged on both sides of the main body 1a, and the electrically conductive plates 4a and 4b installed in the main body 1a and connected with the antenna elements 11a to 11d. In the main body 1a, the circuit board 5 having the high frequency ground pattern thereon and the reflective plate 6 are disposed on the rear surface side of the electrically conductive plates 4a and 4b in order to exert their reflective ability to focus the directivity of the antenna assembly to its front surface side. When the wrist-mounted-type portable radio apparatus 45 is mounted on a user's wrist, the rear case 9 thereof is contacted with the user's wrist. However, the antenna assembly 13 of the wrist-mounted-type portable radio apparatus 45 is shielded by the rear case 9 and the reflective plate 6 against the wrist, and can prevent the adverse affects from the human body.

The electrically conductive plate 4b is, as in the wrist-mounted-type portable radio apparatus 40 of the sixth embodiment, connected at the terminal point 16a to the high frequency amplifier 14, which is connected to the ground 15 of the circuit board 5. The electrically conductive board 4a is connected via the point 16b to the ground 15 of the circuit board 5. The electrically conductive plates 4a and 4b are unbalanced in their voltage level. Accordingly, the electrically conductive plate 4a is disposed closer than the plate 4b to the noise sources such as the DC-DC converter 501 in the digital circuit 5a.

The electrically conductive plate 4a is divided into two portions in the main body 1a. Both ends 4h and 4i of the plate 4a are connected to the negative side (grounding side) of the battery 8 (e.g., a button type battery). Therefore, the impedance level of the electrically conductive plate 4a becomes low.

In the wrist-mounted-type portable radio apparatus 45, noise sources such as the DC-DC converter 501, are included in the digital circuit 5a. However, as in the above embodiments, the electrically conductive plate 4a having the low impedance is disposed near the digital circuit 5a. On the contrary, the electrically conductive plate 4b having the high impedance is disposed far from the digital circuit 5a. Therefore, the electrically conductive plates 4a and 4b are arranged to prevent adverse affects of noise generated from the digital circuit 5a. In addition to the above, the wrist-mounted-type portable radio apparatus 45 has the same effect as described in the sixth embodiment.

From the view point of the circuit for processing the high frequency wave, both edges 4h and 4i of the electrically conductive plate 4a can be connected to the positive side of the battery 8. To use the above connecting arrangement, a capacitor that functions as the reactance element having a low impedance at the high frequency band should be inserted between the point 16b of the electrically conductive plate 4a and the ground 15 as shown in FIG. 22A by dotted line 46.

Eighth Embodiment

Figure 22B:
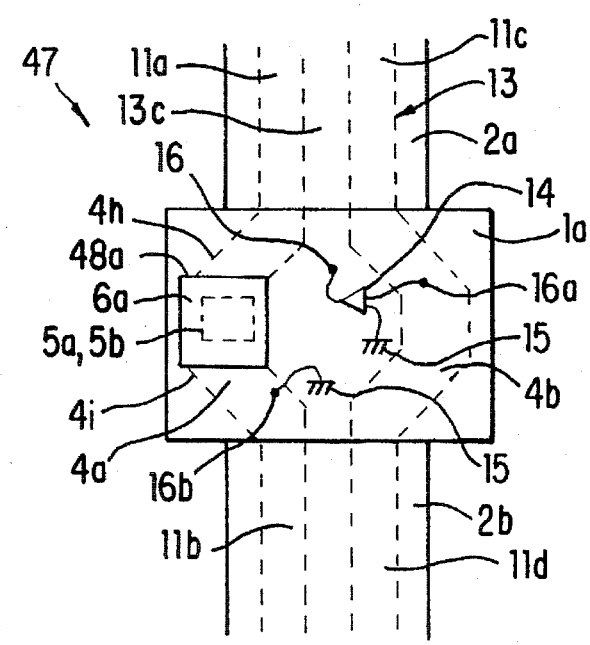
FIG. 22B illustrates a layout of respective portions of a wrist-mounted-type portable radio apparatus according to an eighth embodiment of the present invention.

FIG. 22B is a sectional plan view of an eighth embodiment of the wrist-mounted-type portable radio apparatus 47.

In the wrist-mounted-type portable radio apparatus 47, as in the sixth embodiment, the electrically conductive plate 4b is connected via the point 16a to the high frequency amplifier circuit 14, which is connected to the ground 15 of the circuit board 5. The electrically conductive plate 4a is disposed near the noise sources in the digital circuit 5a and in the analog circuit 5b.

The electrically conductive plate 4a is divided into two parts in the main body 1a as in the seventh embodiment. Both ends 4h and 4i of the plate 4a are connected to the shielding case 48a for shielding the noise source 6a located in the digital circuit 5a and in the analog circuit 5b. Accordingly, the impedance of the electrically conductive plate 4a becomes low. The shield case 48a can be connected to either the negative side (cathode) or to the positive side (anode) of the battery 8. If the shield case 48a is connected to the positive side of the battery, a capacitor having a low impedance should be inserted between the point 16b and the ground 15.

In the wrist-mounted-type portable radio apparatus 47, if the noise leaks from the shielding case 48a, such noise may not adversely affect the electrically conductive plates 4a and 4b because the plate 4a having the low impedance is disposed near the shielding case 48a and the plate 4b having the high impedance is disposed far from the shielding case 48a.

Figure 23:
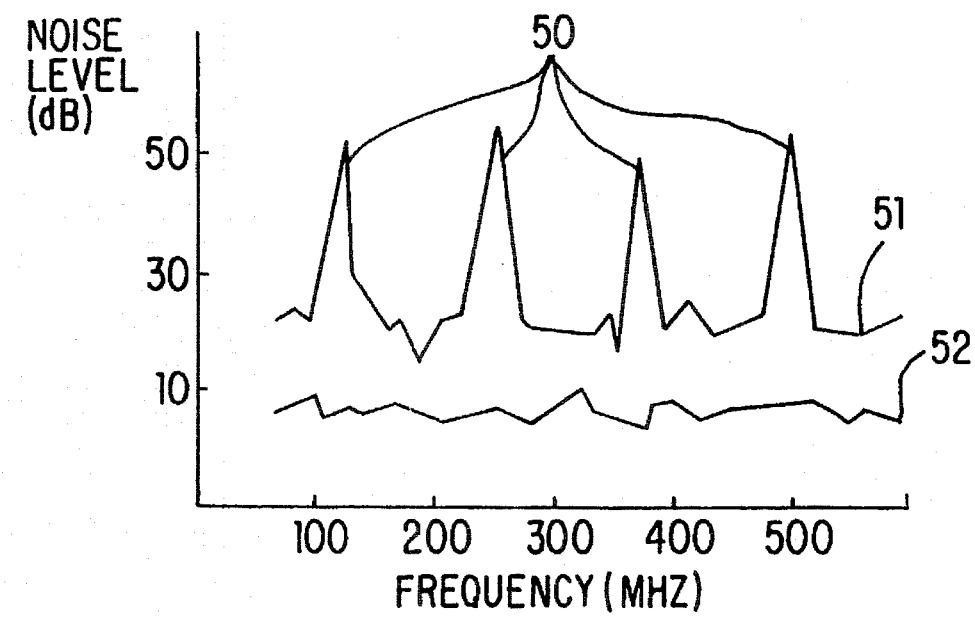
FIG. 23 is a graph showing the noise reduction level obtained by each of the wrist-mounted-type portable radio apparatus of the sixth to eighth embodiments.

For example, in the conventional wrist-mounted-type portable radio apparatus, if the super heterodyning method is applied as shown in FIG. 6A, a noise having the frequency of n times the signal frequency generated from the reference oscillator 210, for example 50 kHz (50×n), is generated. If the direct conversion method is applied as shown in FIG. 6B, a noise is generated by the quartz crystal oscillator of the local oscillator 307. This noise is shown in FIG. 23 by solid line 50. In FIG. 23, the solid line 51 shows the level of the other digital noise generated in the digital circuit. Both noises 50, 51 in the FIG. 23 are at relatively high levels. When the direct conversion method is applied, since the tuning frequency of the antenna assembly 13 should be the same as the oscillation frequency of the local oscillator, the oscillated signal from the local oscillator may enter easily into the antenna assembly 13. However the wrist-mounted-type portable radio apparatus as explained in the above embodiment 6 to 8 has the electrically conductive plate 4b with the high impedance at the high frequency band disposed far from the noise sources. Therefore the noise cannot be caught easily by the antenna assembly 13. Consequently, the noise level caught by the antenna assembly 13 can be reduced to the level shown in FIG. 23 by solid line 52.

Ninth Embodiment

Figure 24:
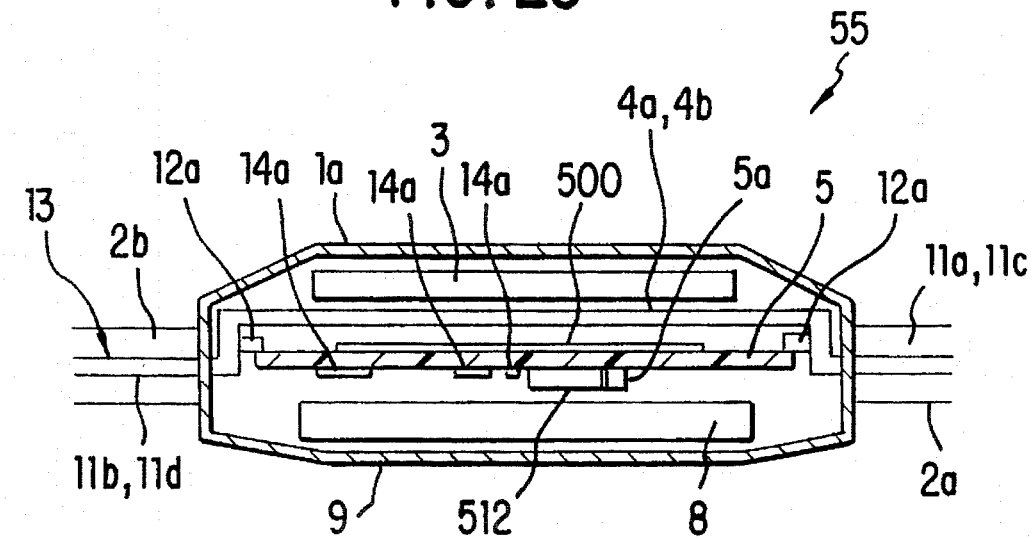
FIG. 24 is a partial schematic cross-sectional view of a wrist-mounted-type portable radio apparatus according to a ninth embodiment of the present invention.

FIG. 24 is a vertical sectional view of the main body of a wrist-mounted-type portable radio apparatus 55 according to a ninth embodiment.

In order to protect the antenna assembly 13 from the noise generated in the local oscillator 512 in the main body 1a, the wrist-mounted-type portable radio apparatus 55 has the local oscillator 512 disposed on the rear surface side of the circuit board 5, and the ground pattern surface 500 provided either on the front surface or the rear surface of the circuit board 5 for covering the front surface facing portion of the local oscillator 512. In addition, the rear surface area of the local oscillator 512 is covered by the battery 8. Since the rear surface of the battery 8 that faces the rear case 9 is its positive side, the rear surface area of the local oscillator 512 is covered by the negative side (ground side) thereof. Using the above arrangement, the local oscillator 512 can be covered by the components having the same electrical potential level to obtain a better shielding effect against the noise generated in the local oscillator.

Tenth Embodiment

Figure 25:
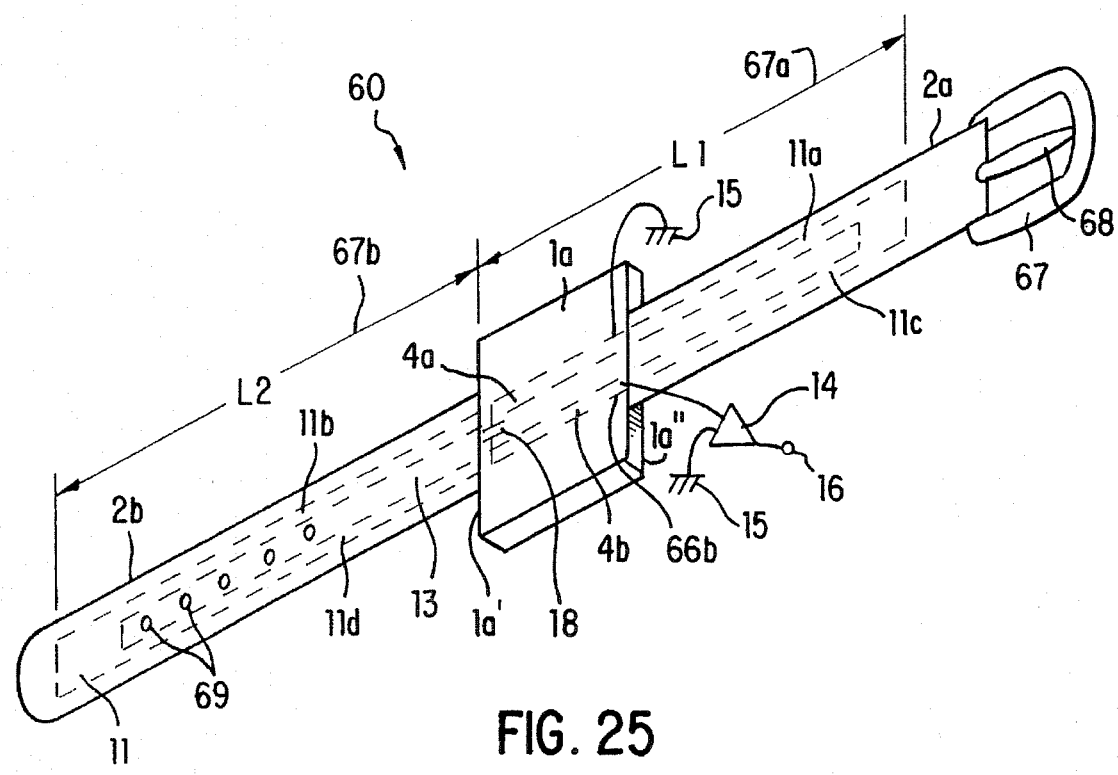
FIG. 25 shows an antenna assembled in a wrist-mounted-type portable radio apparatus according to a tenth embodiment of the present invention.

In FIG. 25, the outline of a wrist-mounted-type portable radio apparatus 60 according to a tenth embodiment is illustrated.

The wrist-mounted-type portable radio apparatus 60 has a main body 1a, and wrist bands 2a and 2b attached on the main body 1a for mounting it on the wrist as in the sixth embodiment. The wrist-mounted-type portable radio apparatus 60 also has the clasp 67 on the distal end of the band 2a, and the holes 69 on the band 2b for receiving the lock pin 68 of the clasp 67. The holes 69 are arranged on the slot 13c of the antenna assembly 13 installed in the band 2b.

The wrist-mounted-type portable radio apparatus 60 has the antenna assembly 13 constructed of the electrically conductive plates 4a and 4b installed in the main body 1a, and the antenna elements 11a to 11d fixed on the bands 2a and 2b, which are electrically connected to each other by the electrically conductive plates 4a and 4b.

In this wrist-mounted-type portable radio apparatus 60, the length of the wrist band 2b is longer than that of the band 2a so that the antenna elements 11b and 11d fixed in the band 2b are longer than the elements 11a and 11c fixed in the band 2a. However in the antenna assembly 13, the length L1 of a portion 67a including the antenna elements 11a, 11c and the electrically conductive plates 4a, 4c is equal to the length L2 of a portion 67b including the antenna elements 11b and 11d. The portions 67a and 67b are joined on an edge 1a' of the main body 1a at which the wrist band 2b is connected, and which is the six o'clock position in the wrist watch. Therefore, the capacitor 18 which must be provided on the center of the antenna assembly 13, can be connected to the antenna assembly 13 in the main body 1a at its edge 1a'.

The wrist band 2a is Joined on the main body 1a at the other edge 1a" which is the twelve o'clock position. At the edge 1a" in the main body 1a, the electrically conductive plate 4a is connected to the ground 15, and the other electrically conductive plate 4b is connected to the high frequency wave (RF) amplifier circuit 14. The connecting point to the RF amplifier circuit 14 is the electrical power feeding point 66b. Therefore, in the wrist-mounted-type radio apparatus, the power feeding point 66b is moved away from the connecting point of the capacitor 18.

The high frequency wave amplifier circuit 14 is connected to the downstream (following) circuits via the terminal 16. The constitution and operation of the downstream circuits are as shown in FIG. 5.

Figure 26:
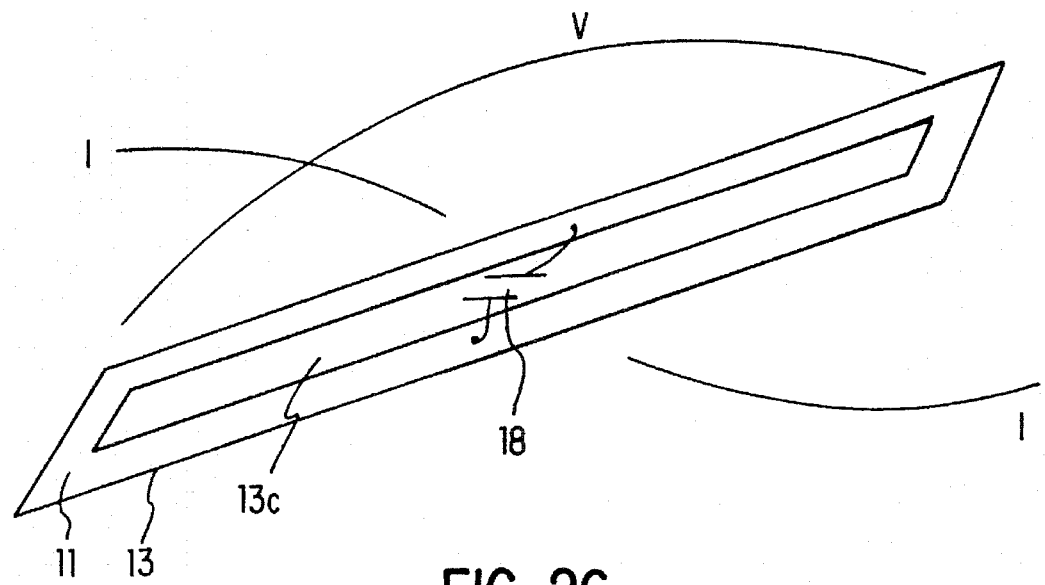
FIG. 26 shows a slot antenna for explaining the distribution of the electrical current and voltage in the antenna of FIG. 25.

Referring to FIG. 26, the operation of the antenna assembly 13 (slot antenna) is now explained.

Since the antenna assembly 13 is a magnetic flow type, the voltage distribution is as shown by the solid line V and the current distribution is as shown by the solid line I. The impedance Z at the any location of the antenna plate 11 is determined by the following equation:

$$Z=V/I$$

According to the above equation, the impedance of the antenna plate 11 near the capacitor 18 becomes very high. The input impedance of the RF amplifier circuit 14 is 50 to 100Ω. Therefore, in order to obtain impedance matching between the RF amplifier circuit 14 and the antenna assembly 13, the impedance of the antenna assembly 13 must be low. Accordingly, if the power feeding point 66b can be located at a position other than the position of the capacitor 18 connecting point, impedance matching can be made at a position having the lower impedance.

Figure 27:
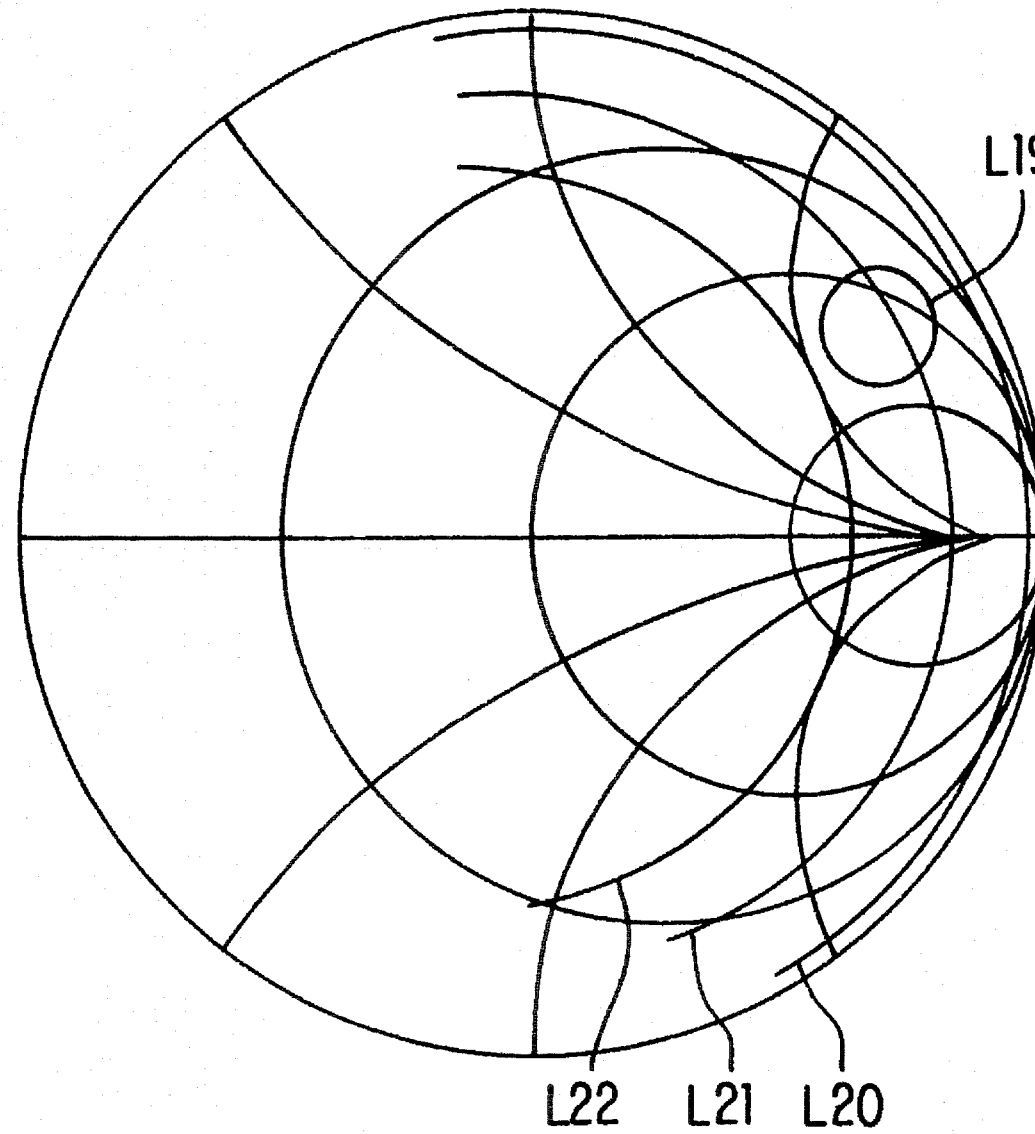
FIG. 27 is a graph showing a relationship between the position of the feed point and impedance characteristics in the apparatus of FIG. 25.

In FIG. 27, a property of the input impedance of the antenna assembly 13 is shown. Using FIG. 27, the property of the input impedance of the antenna assembly 13 depending on the power feeding position 66b can be determined. For example, the solid line L20 is the property of the input impedance if the power feeding position 66b is located near the connecting point of the capacitor 18. The solid line L21 is the property of the input impedance if the power feeding position 66b is located near the center of the portion 67a containing the antenna elements 11a and 11c. The solid line L22 shows the property of the input impedance if the power feeding position 66b is locate near the distal end of the antenna elements 11a and 11c. A circular portion (range) using a solid line L19 shows an optimum impedance range for the high frequency wave amplifier circuit 14. According to the above case studies, the property of the input impedance shown by the line L21, which crosses the circular portion L19, is preferable. To obtain such property, the power feeding position 66b should be moved from the connecting point of the capacitor 18 to near the middle point of the portion 67a containing the antenna elements 11a and 11c.

When the power feeding point 66b is located on the position for obtaining the property of line L20 or line L22, additional matching circuits are required to equalize the impedance of the antenna assembly 13 and the high frequency wave circuit 14. However, the use of matching circuits results in problems such as additional elements and other parts for constituting a circuit. When the power feeding point 66b is moved from the connecting point of capacitor 18 to the position at which the optimum impedance can be obtained, impedance matching can be easily achieved without additional elements and other parts, thus facilitating miniaturization and reducing costs.

The wrist-mounted-type portable radio apparatus 60, using the popular wrist band, which has the longer wrist band 2b at the six o'clock position side thereof and the shorter wrist band 2a at the twelve o'clock position side thereof, enables the capacitor 18 to be connected near the edge 1a' and the feeding point 66b near the other edge 1a" in the main body 1a, thus facilitating movement of the power feed point away from the capacitor 18 connecting position by the width of the main body 1a. Therefore, the present radio apparatus can realize both conditions that the capacitor 18 is connected on the center of the antenna assembly 13, and the feed point 66b is located at a position spaced therefrom.

Eleventh Embodiment

Figure 28A:
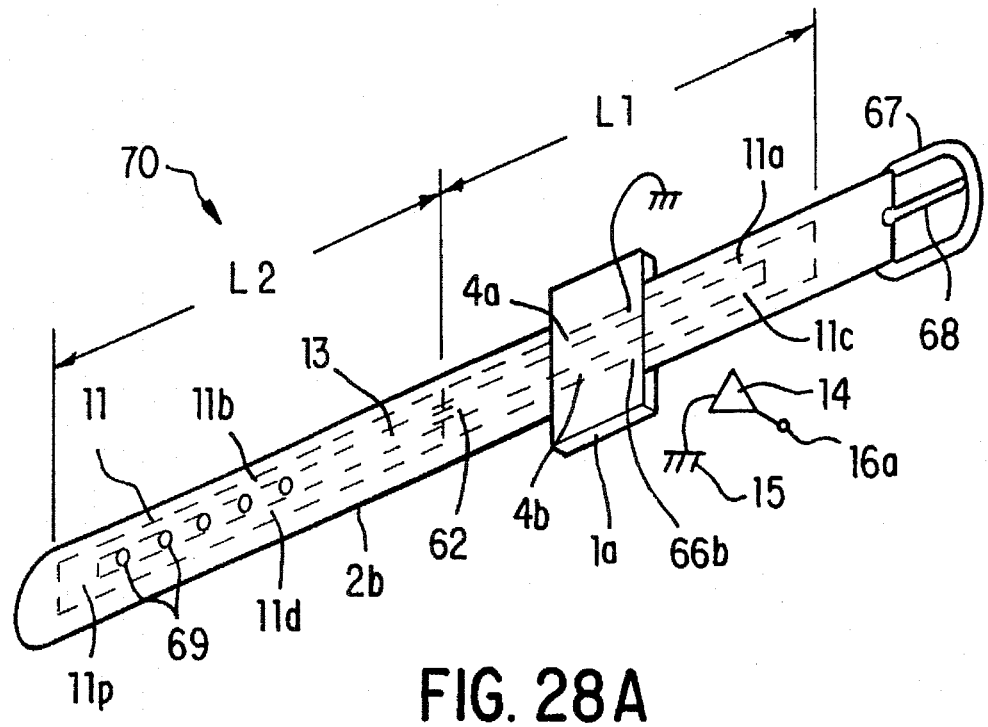
FIG. 28A illustrates a structure of the antenna of a wrist-mounted-type portable radio apparatus according to an eleventh embodiment of the present invention.
Figure 28B:
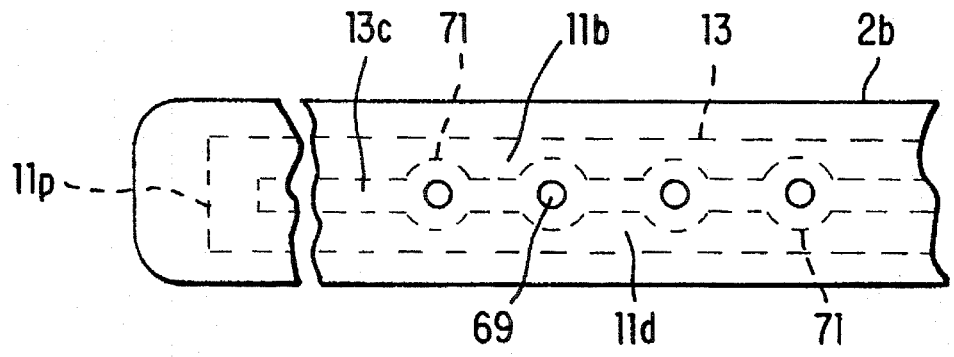
FIG. 28B shows a structure of holes formed in a wrist band of the radio apparatus of the eleventh embodiment.

FIG. 28A illustrates the antenna assembly 13 of a wrist-mounted-type portable radio apparatus 70 according to an eleventh embodiment. FIG. 28B illustrates the construction of the holes made on the band of the wrist-mounted-type portable radio apparatus 70.

As shown in FIG. 28A, in the wrist-mounted-type portable radio apparatus 70, the antenna elements 11b and 11d are longer than the antenna elements 11a and 11c, however a capacitor 62 is installed on the middle point of the length of the antenna assembly 13 (namely where the lengths L1 and L2 shown in FIG. 28A meet). The middle point is positioned in the wrist band 2b in which the antenna elements 11b and 11d are installed.

As shown in FIG. 28B, in order to increase the connection strength between bands 2a and 2b, the holes 69 having generally the same diameter as the width of the slot 13c are provided on the band 2b. Additionally, the antenna elements 11b and 11c provided in the band 2b have wide portions 71 that have an extended slot width. Accordingly, the antenna elements have narrower portions. However the sensitivity of the antenna assembly 13 is not decreased because the current distribution of the antenna elements is concentrated on the distal end 11p, which has a wider width.

Figure 29:
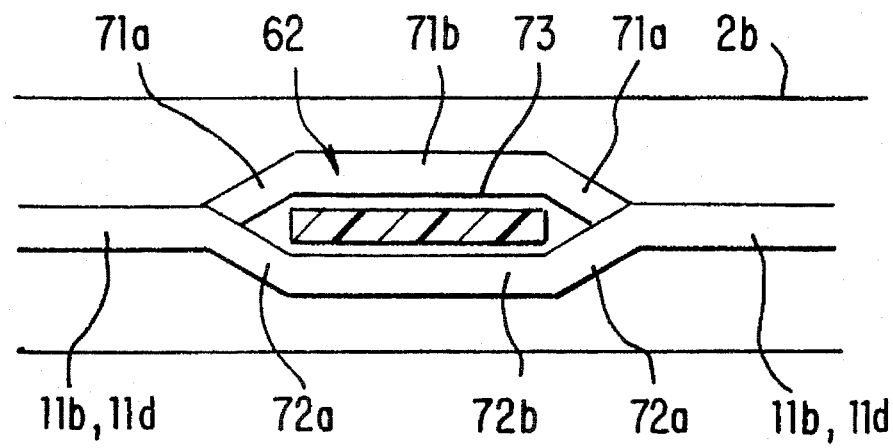
FIG. 29 illustrates a sectional structure of a capacitor formed on the antenna of FIG. 28.
Figure 30:
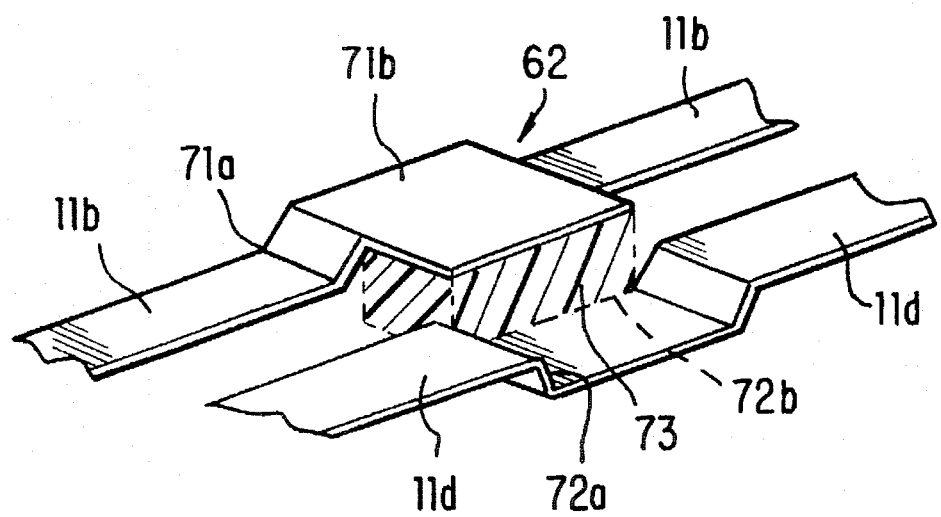
FIG. 30 illustrates a structure of a capacitor formed on the antenna of FIG. 28.

In the wrist-mounted-type portable radio apparatus 70, the antenna elements 11b and 11d are used for installing the capacitor 62 in the wrist band 2b. As shown in FIG. 29 and FIG. 30, in which the construction of the capacitor 62 is enlarged, the antenna element 11b has a step like portion 71a, and a platform portion 71b that projects toward the antenna element 11d. The antenna element 11d also has a step like portion 72a, and a platform portion 72b that projects toward the antenna element 11b. A dielectric material 73 is provided in the area between the platform portions 71b and 72b. When a surface area facing between the platform portions 71b and 72b is S, a dielectric constant in a vacuum condition of the dielectric material is $\epsilon_0$, a specific dielectric constant of the dielectric material is $\epsilon_r$, a length between platforms 71b and 72b is d, a capacitor 62 having the capacitance C shown by the following equation is realized:

$$C = \epsilon_0 \cdot \epsilon_r \cdot S/d$$

Accordingly, the capacitor 62 can be disposed outside of the main body 1a. Hence, the capacitor 62 can be located at the center of the antenna assembly length even when the main body 1a is not located at the center of the length of the antenna assembly 13, so as to upgrade its sensitivity. Since the main body 1a need not be located at the center of the length of the antenna assembly 13, the main body 1a can be moved to locate the feeding point 66b at the most optimum position for impedance matching without any relationship to the position of the capacitor 62.

Since the dielectric material 73 can be selected from among a hide (e.g., leather), silicone resin, urethane resin and the like, the material for the wrist band 2a and 2b also can be used as the dielectric material. Therefore, the capacitor 62 can be introduced into the bands 2a or 2b during the fabrication process of the wrist band. When the specific dielectric constant $\epsilon_r$ of the material for the bands 2a and 2b is 3 to 5, the surface area S facing between the platform portions 71b and 72b is 25 square millimeter, and the facing distance d between the platform portions 71b and 72b is 0.3 mm, the capacitance C becomes 2 to 4 pF, which is sufficient for the capacitor 62 applied to the wrist-mounted-type portable radio apparatus 70 operated under the UHF (ultra high frequency) band.

Twelfth Embodiment

Figure 31:
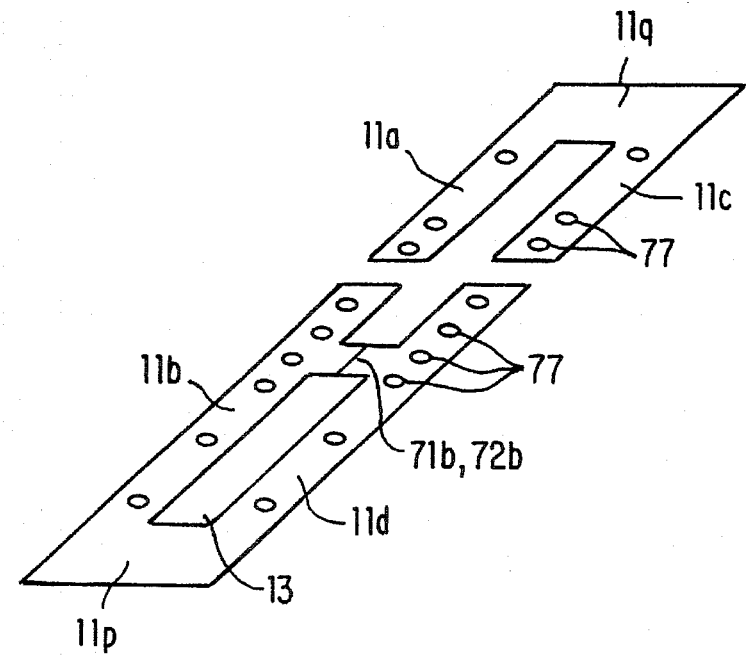
FIG. 31 is a perspective view of an antenna of a wrist-mounted-type portable radio apparatus according to a twelfth embodiment of the present invention.
Figure 32:
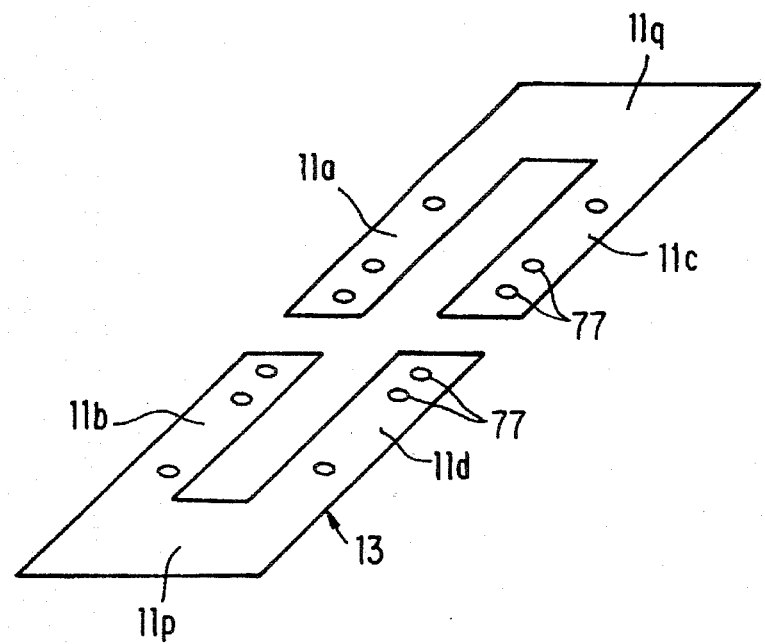
FIG. 32 is a perspective view of another example of the antenna of the radio apparatus of the twelfth embodiment.

FIG. 31 is a perspective view showing the construction of an antenna assembly installed in a wrist-mounted-type portable radio apparatus according to a twelfth embodiment.

The antenna assembly 13 of the wrist-mounted-type portable radio apparatus 70 has holes 77 near the platform portions 71b and 72b for constituting the capacitor 62 as explained in the eleventh embodiment. A hole rate (i.e., the density or frequency of the holes per unit area) or a concentration of the small holes 77, is rather high adjacent to the platform portions 71b and 72b. The density of the holes 77 decreases towards the distal ends 11p and 11q, and finally no holes are provided at the distal ends 11p and 11q.

In the wrist-mounted-type portable radio apparatus, the impedance around the platform portions 71b and 72b is high, so that it can be affected by the human body when mounted on the user's wrist. This causes miss-matching of impedance between the antenna assembly 13 and the high frequency amplifier circuit connected thereto, which decreases the sensitivity. However, the wrist-mounted-type portable radio apparatus having holes 77 on the area having high impedance reduces the area of the surface that faces the human body. Therefore the affects from the human body to the portable radio apparatus are minimized. The current distribution around the platform portions 71b and 72b is small so that the openings 77 do not cause a significant increase of resistivity. At the distal ends 11p and 11q of the antenna assembly 13, where the current distribution is high, no holes 77 are made to prevent the resistivity from increasing.

When the capacitor 62 using the platform portions 71b and 72b of the antenna assembly 13 is not provided, the holes 77 having the high opening rate at the center of the length of the antenna assembly 13 and within opening rate that decreases towards the distal ends 11p and 11q can prevent the adverse affects from the human body.

Thirteenth Embodiment

Figure 33:
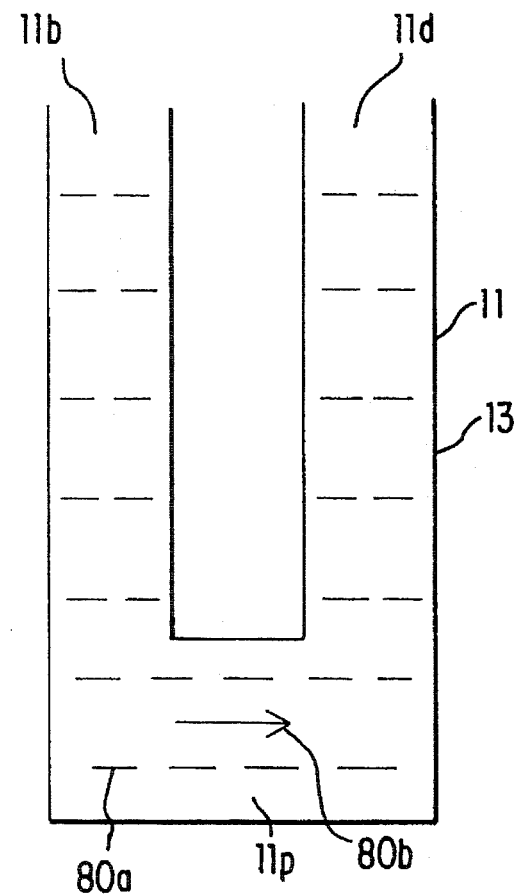
FIG. 33 is partial plan view of an antenna arranged in a wrist band of a wrist-mounted-type portable radio apparatus according to a thirteenth embodiment of the present invention.
Figure 34:
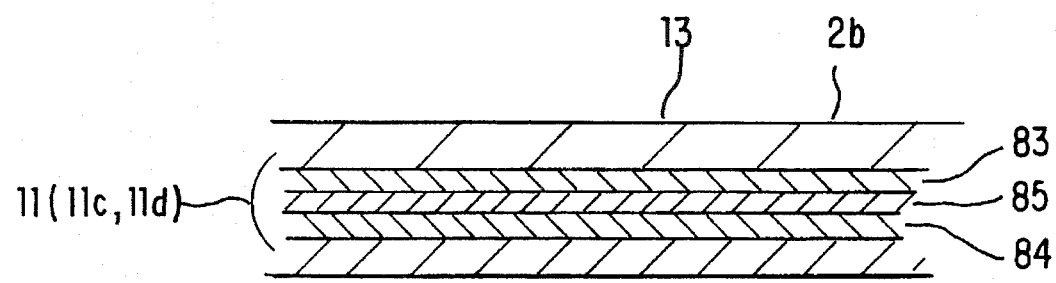
FIG. 34 is a sectional view of the antenna of FIG. 33.

FIG. 33 is a plan view of the antenna assembly of a wrist-mounted-type portable radio apparatus of a thirteenth embodiment. FIG. 34 is a sectional view.

The wrist-mounted-type portable radio apparatus of the thirteenth embodiment has all the characteristics explained for the first to twelfth embodiments. The wrist-mounted-type radio apparatus also has the antenna assembly 13 having an improved electrical property, and an antenna plate 11 by which such improvement is realized also has an optimized construction for facilitating manufacturing.

The antenna plate 11 is made of a stainless material or from other materials having a sufficient stiffness (i.e., strength) and resistance to rust. The antenna plate 11 is manufactured by a rolling process in which the material is pulled under a pressurized condition. Therefore, the antenna plate 11 has raised and lowered portions on its surface. In FIG. 33, the raised and lowered portions introduced on the surface are shown by dotted lines 80a corresponding to the raised portions. When the high frequency signal passes through the antenna plate 11, the corresponding current flows through the surface or skin of the antenna plate 11 according to the skin effect. The skin depth $\delta$, which is the depth by which the current permeates into the antenna plate 11, is calculated using the following equation based on a magnetic permeability in vacuum condition $\mu_0$ of the material, a frequency f of the high frequency signal, and an electrical conductivity $\sigma$ of the material:

$$\delta = 1/\sqrt{(\pi \cdot f \cdot \mu_0 \cdot \sigma)}$$

Accordingly, the loss of resistivity of the antenna plate is decreased in this embodiment because the direction of the raised and lowered portions 80a is equal to the current arrow 80b.

The present antenna plate 11 has, as shown in FIG. 4, an upper layer 83 and a lower layer 84 in both the distal end portions 11p. The direction of the raised and lowered portions shown by the dotted line 80a made by the rolling process coincides with the direction of the current shown by the arrow 80b. In a middle layer 85, the direction of the raised and lowered portions crosses (i.e., is perpendicular to) the direction of current shown by arrow 80b. That is, the present antenna plate 11 has the upper layer 83, the middle layer 85 and the lower layer 84, each having different rolling directions so that the bending strength of the antenna plate 11 is high. The antenna plate 11 does not break even if a large force is repeatedly applied when the wrist-mounted-type portable radio apparatus is mounted on the wrist.

Fourteenth Embodiment

Figure 35:
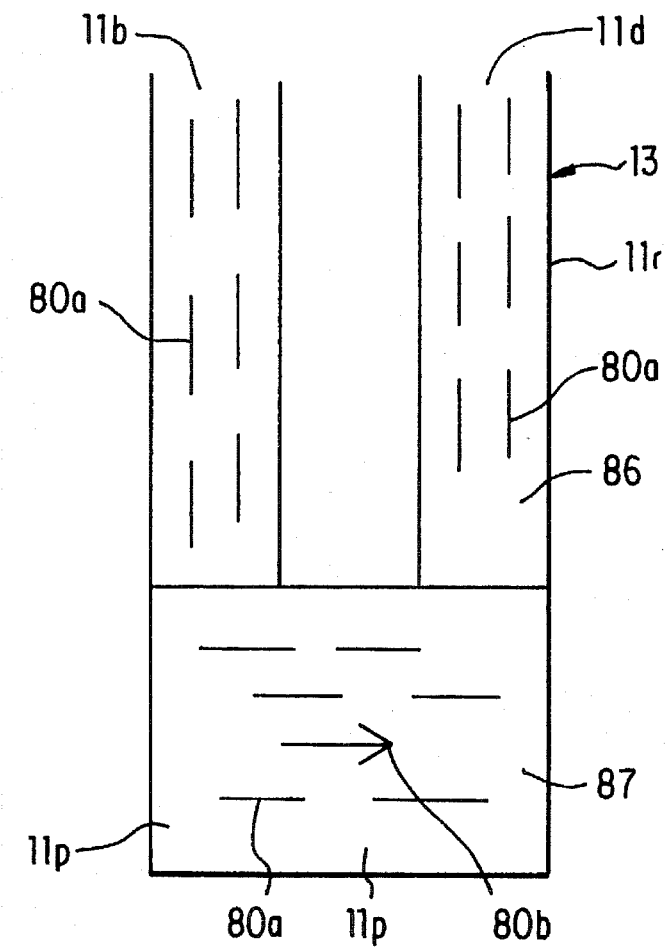
FIG. 35 is a partial plan view of an antenna arranged in a wrist band of a wrist-mounted-type portable radio apparatus according to a fourteenth embodiment of the present invention.

In order to keep the stiffness of the antenna assembly 13 high and to reduce its resistivity loss, as shown in FIG. 35, the portion 11r of the antenna plate 11 at which a large force is applied when the wrist-mounted-type portable radio apparatus is mounted on the wrist, is made of a plate member 86 having the raised and lowered portions created during the rolling process so that they extend in the longitudinal direction. The distal portion 11p at which the electrical distribution is large is made of the plate member 87, with raised and lowered portions 80a extending in the same direction as the current shown by the arrow 80b.

Fifteenth Embodiment

Figure 36:
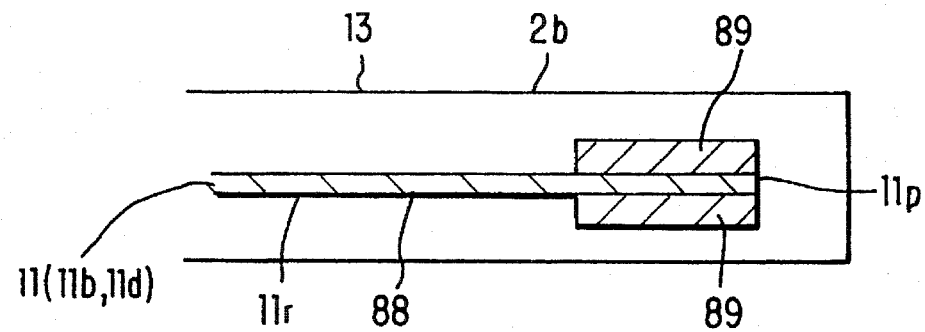
FIG. 36 is a sectional view of an end of an antenna arranged in a wrist band of a wrist-mounted-type portable radio apparatus according to a fifteenth embodiment of the present invention.

In order to maintain the stiffness of the antenna assembly 13 high and to reduce its loss of resistivity, as shown in FIG. 36, the portion 11r of the antenna plate 11 at which a large force is applied when the wrist-mounted-type portable radio apparatus is mounted on the wrist is made of a plate member 88 having a high strength, while the distal portion 11p at which the electrical distribution is large is made of the plate member coated (plated) by a highly conductive layer 89 such as copper and silver. The thickness of the coated layer 89 must be higher than the skin depth δ, which is the depth by which the current permeates into the antenna plate 11.

Sixteenth Embodiment

Figure 37:
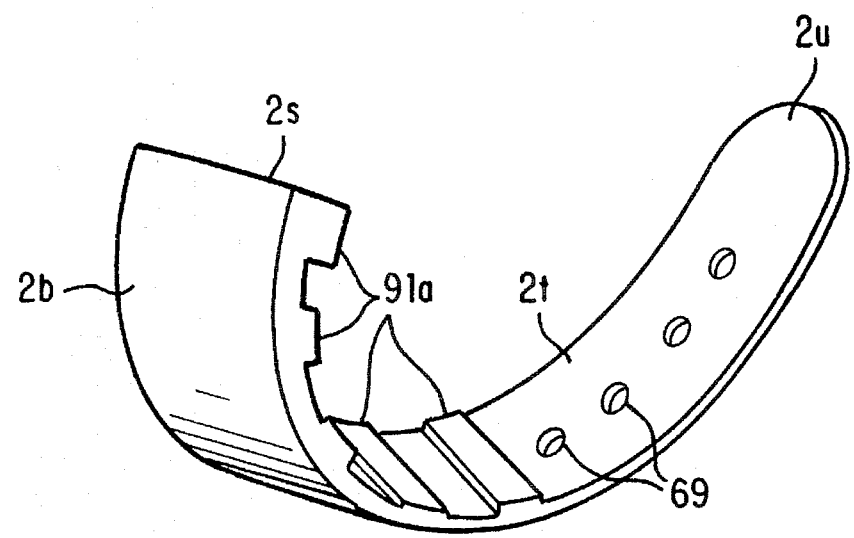
FIG. 37 is a perspective view of a wrist band viewed from the inner side thereof of a wrist-mounted-type portable radio apparatus according to a sixteenth embodiment of the present invention.
Figure 38:
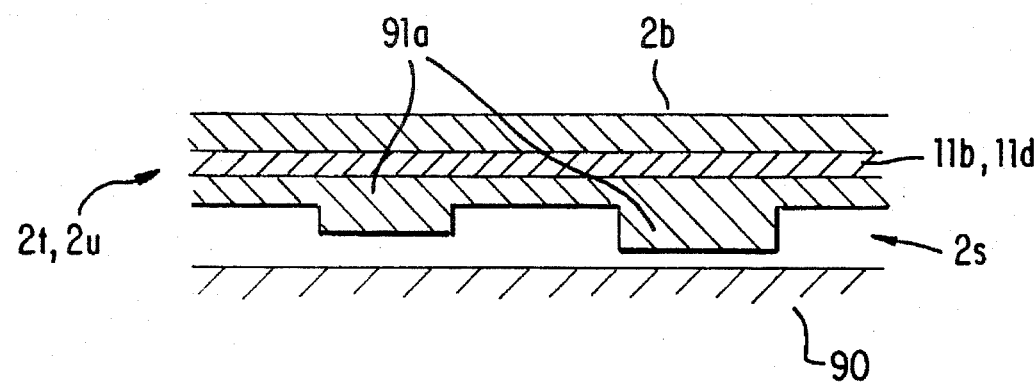
FIG. 38 is a partial sectional view of the wrist band of FIG. 37.

FIG. 37 illustrates the construction of the rear surface of the wrist band of a wrist-mounted-type portable radio apparatus according to a sixteenth embodiment. FIG. 38 is its sectional view.

The wrist-mounted-type portable radio apparatus has a plurality of raised areas 91a across the length of the wrist band 2b on its rear surface between its proximal end 2s, which is connected with the main body 1a, and near its distal portion 2t having the holes 69. The height of the raised portions 91a gradually decreases from the proximal end 2s toward the distal end 2t of the wrist band 2b. In addition, the wrist-mounted-type portable radio apparatus has features explained in the previous embodiments 1 to 15.

Since the portions of antenna elements 11b and 11d located on the proximal end 2s of the wrist band 2b have the relatively high impedance, it tends to be affected by the human body. However, in the present embodiment, the wrist band 2b has the raised areas 91a on its proximal end 2s so as to maintain a predetermined space between the antenna elements 11b and 11d and the user's wrist 90. Since the impedance at the distal end 2u of the wrist band 2b is low and the affects of the human body are negligible, no (or smaller) raised areas 91a are prepared thereon so that the user can apply the wrist bands easily. Since the proximal end 2s of the wrist band 2b has a larger curvature than other parts thereof when it is mounted on the wrist, the higher raised areas 91a prepared on the proximal end 2s of the band makes it easy to bend.

In the wrist-mounted-type portable radio apparatus, wherein the portions of the antenna elements 11b and 11d having the high impedance are positioned to maintain the space against the user's wrist 90, the impedance shift of the antenna assembly can be prevented. Therefore, the present portable radio apparatus has high sensitivity.

Seventeenth Embodiment

Figure 39:
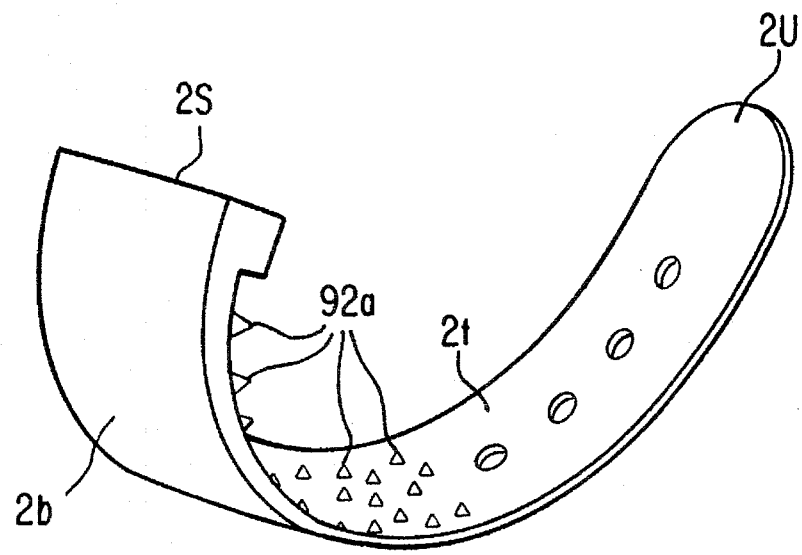
FIG. 39 is a perspective view of a wrist band viewed from the inner side thereof of a wrist-mounted-type portable radio apparatus according to a seventeenth embodiment of the present invention.
Figure 40:
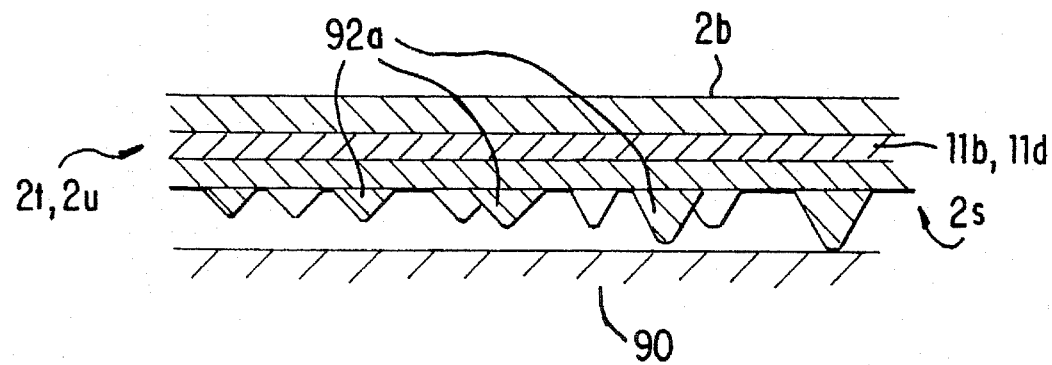
FIG. 40 is a partial sectional view of the wrist band of FIG. 39.

A wrist-mounted-type portable radio apparatus according to a seventeenth embodiment has a wrist band 2b having a plurality of generally hemispherical projections 92a, as shown in FIG. 39 and FIG. 40, on its rear surface instead of the raised areas 91a extended across the length as in the previous sixteenth embodiment. As in the sixteenth embodiment, the projections 92a are arranged on the proximal ends 2s of the band 2b, which is connected with the main body 1a and contains the portions of elements 11b, 11d having a large impedance. The projections 92a maintain a predetermined space between the human wrist 90 and the antenna elements 11b and 11d so as to prevent the adverse affects from the human body. Therefore, in the wrist-mounted-type portable radio apparatus, the affects from the user's wrist 90 to the portion having the highest impedance among the antenna plate 11 is prevented. Therefore, the antenna impedance does not shift, and the antenna has a high sensitivity. The relatively higher projections prepared on the proximal end of the wrist band makes it easy to bend the band.

Eighteenth Embodiment

Figure 41:
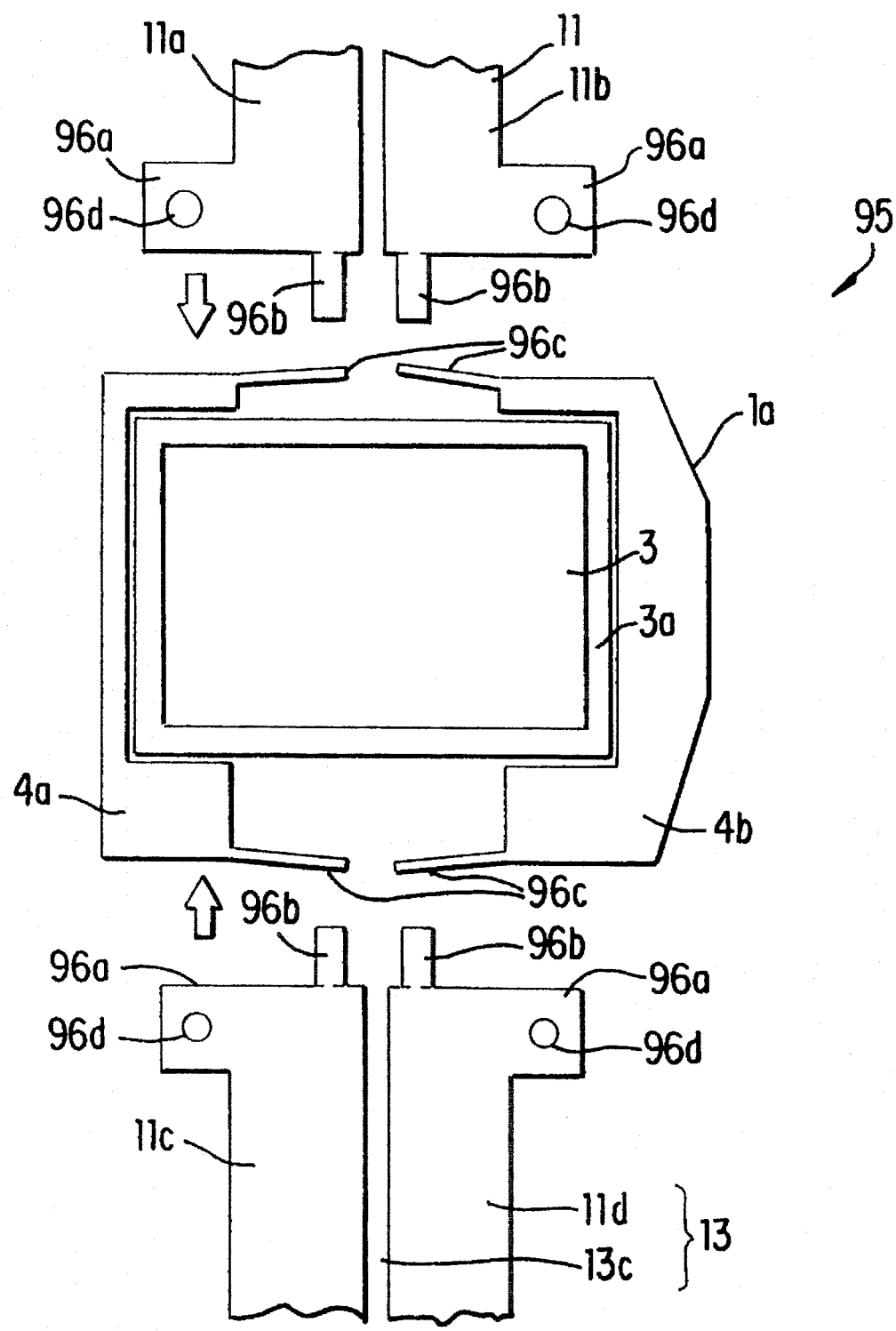
FIG. 41 shows a wrist-mounted-type portable radio apparatus according to a eighteenth embodiment of the present invention, wherein a main body of the radio apparatus is disconnected from a pair of wrist bands.
Figure 42:
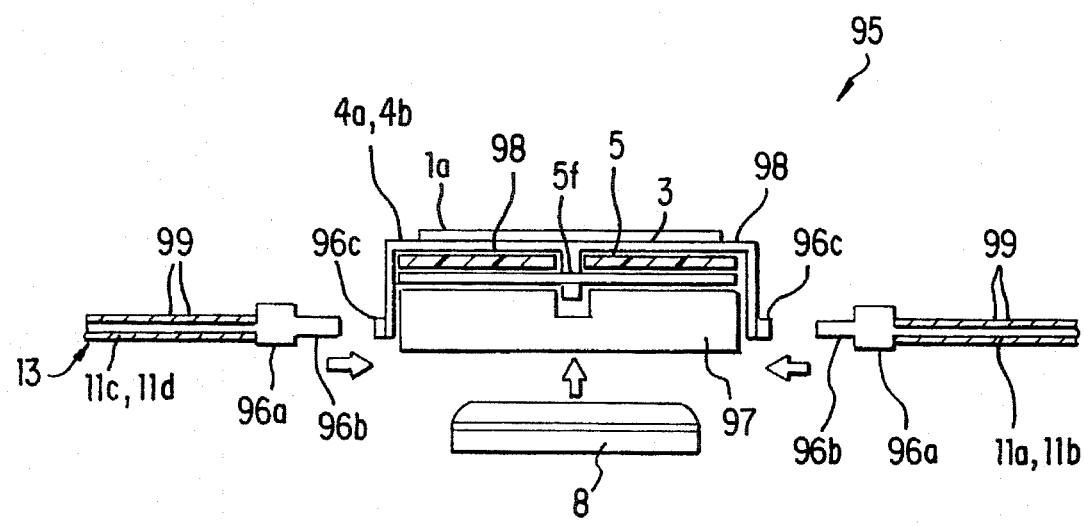
FIG. 42 is an exploded sectional view of the radio apparatus of FIG. 41.

FIG. 41 is an exploded view of the main body of a wrist-mounted-type portable radio apparatus 95 according to an eighteenth embodiment. FIG. 42 is a sectional view.

The wrist-mounted-type portable radio apparatus 95 has a pair of wrist bands (not shown in the figure) attached on both ends of the main body 1a. The main body 1a has a data displaying unit 3 for displaying information on the front surface thereof, a panel frame 3a around the data displaying unit 3, and electrically conductive plates 4a and 4b on both outer sides of the frame 3a. The wrist-mounted-type portable radio apparatus 95 has an antenna assembly 13 comprised of an antenna plate 11 having a plurality of antenna elements 11a to 11d fixed on the wrist band, a plurality of contact plates 96a attached on each of the antenna elements 11a to 11d, and a plurality of fixing pins 96b attached to the proximal end of each antenna element 11a to 11d to be electrically contacted to a plurality of spring plates 96c attached to each end of the electrically conductive plates 4a and 4b. The electrically conductive plates 4a and 4b, and each antenna element 11a to 11d are fixed to each other by screws, for example, using a plurality of screw holes 96d made on the contact plate 96a on each antenna element 11a to 11d.

The main body 1a contains the following parts from its front surface side, as shown in FIG. 42: the data displaying unit 3, a circuit board 5, a battery frame 97, a battery 8, and a rear case (not shown in the figure). The electrically conductive plates 4a and 4b are disposed on sides of the data displaying unit 3, and the circuit board 5 is located on a rear surface side of the electrically conductive plates 4a and 4b. A piece 5f fixes the conductive plates 4a and 4b to the circuit board 5.

The main body 1a has a high dielectric material layer 98 on the rear surface side of the electrically conductive plates 4a and 4b made of BaO—TiO$_2$, TiO$_4$, BaO$_3$, a low loss dielectric ceramic layer, and the like. High dielectric material layers 99 made of BaO—TiO$_2$, TiO$_4$, BaO$_3$, a low loss dielectric ceramic layer and the like, are disposed on the front surface side and rear surface side of the antenna elements 11a to 11d, and the dielectric material layers 99 also are injected into the slot 13c between the respective antenna elements 11a to 11d. Ceramic such as BaO-TiO$_2$, TiO$_4$, BaO$_3$, and the like, has a specific dielectric constant of 8 to 40, which is higher than that of polyester resin (specific dielectric constant is 3.2 to 4.8) or of silicone resin (specific dielectric constant is 3) for making the band.

Since the wrist-mounted-type portable radio apparatus 95 has the circuit board 5 disposed on the rear surface side of the electrically conductive plates 4a and 4b, it has the same advantages detailed earlier, such as the radiation wave can be radiated therefrom without being shielded by the circuit board 5. The wrist-mounted-type portable radio apparatus 95 also has the high dielectric material layer 98 and 99 around the electrically conductive plates 4a and 4b, and the antenna elements 11a to 11d. The wave length λ' in such a high dielectric material can be determined by the following equation using a wave length A and a specific dielectric constant ε of the dielectric material:

$\lambda'=\lambda/\sqrt{\epsilon}$

Therefore, the wave length $\lambda'$ is shortened if the dielectric constant $\epsilon$ in the dielectric material is large.

Accordingly, when the dielectric constant $\epsilon$ in the dielectric material is large, the antenna assembly 13 has an effect as if the length of the slot 13c is increased. Therefore, the wrist-mounted-type portable radio apparatus can have the antenna gain for the radiation wave for longer wave lengths without increasing the length of the slot 13c, namely without increasing the length of the antenna assembly 13.

Further Embodiments

The high dielectric material layers 98 and 99 can be applied to the wrist-mounted-type portable radio apparatus of the embodiments previously explained.

A wrist-mounted-type portable radio apparatus can be provided that has any combination among the features explained above in each embodiment. For example, a wrist-mounted-type portable radio apparatus having the features of embodiments 1, 6, 10, 13 and 16 can have the effect that the radiation wave from the antenna assembly is not shielded because the circuit board is not disposed on the front surface side of the antenna assembly. Since the antenna assembly has the high impedance side arranged far from the noise source of the other circuits, and the low impedance side arranged near the noise source, noise entering the antenna assembly can be prevented. Since the antenna assembly has a pair of different length portions connected to the portable radio apparatus, the optimum location of the power feeding point can be selected. The antenna assembly also has a high impedance part located adjacent to the thicker rear side of the wrist band, therefore the adverse affects from the human body can be reduced. At the same time, the resistive loss of the antenna assembly can be reduced. According to the above combination of features, the wrist-mounted-type portable radio apparatus in accordance with the present invention can have a high sensitivity.

As explained above, according to one aspect of the invention, the antenna assembly is disposed on the front surface side of the circuit board in the main body. Therefore, the above arrangement eliminates the circuit board and other elements from the front surface side of the antenna assembly, preventing the shielding effect to the radiation wave output/received from the antenna assembly.

The antenna assembly may be disposed on the outer frame of a wrist-mounted-type portable radio apparatus so that the antenna slot extending along the length of the antenna assembly faces toward the outside. By this arrangement, no member is located on the front surface side of the antenna assembly so that the sensitivity of the antenna can be increased.

When the side portion of the antenna assembly that is connected to the reference voltage side of the high frequency wave amplifier circuit is disposed near the noise source, and another portion that is connected to the signal (i.e., feed) voltage side of the high frequency wave amplifier circuit is disposed far from the noise source, the noise does not enter into the antenna assembly so that the sensitivity of the portable radio apparatus can be upgraded. Especially when the direct conversion method is applied, since the tuning frequency of the antenna assembly must be the same as the oscillation frequency from the local oscillator, its noise tends to enter the antenna assembly. However, as explained above, if the local oscillator is installed distant from the part of the antenna assembly having the high impedance at the high frequency band, the adverse affects of the noise to the radio itself and to other radios can be reduced.

When the antenna assembly has a different length antenna elements on each side of the main body located in the wrist band, high sensitivity can be realized if the feeding point in the main body can be set at an optimum position spaced from the reactance element.

Introducing a high density of holes near the connecting point of the reactance element, or making the rear surface of the wrist band thick adjacent to this portion, can moderate the adverse affects from the human body so as to maintain impedance matching at a fine level for enhancing sensitivity.

Additionally, the antenna assembly can be constructed so as to reduce the resistivity loss of the high frequency current at the distal end of the antenna assembly, providing an antenna device having a high sensitivity.

While this invention has been described in conjunction with specific embodiments thereof, it is evident that many alternatives, modifications and variations will be apparent to those skilled in the art. Accordingly, the preferred embodiments of the invention as set forth herein are intended to be illustrative, not limiting. Various changes may be made without departing from the spirit and scope of the invention as defined in the following claims.

What is claimed is:

1. A wrist-mounted-type antenna device comprising:

a main body having a front surface that faces away from a user's wrist when mounted around the user's wrist, a rear surface that faces toward the user's wrist when mounted around the user's wrist, and a circuit board in said main body between said front surface and said rear surface, a circuit arranged on said circuit board; and a slot antenna assembly including a slot extending along a length of said antenna assembly, said antenna assembly having a reactance element connected across sides of said slot near a center of a length of said slot, said antenna assembly coupled to said circuit board and at least partly located in said main body between said front surface and said circuit board and spaced from the circuit arranged on said circuit board, whereby an electric field is produced across said slot when said antenna device is operated.

2. A wrist-mounted-type antenna device according to claim 1, further comprising a reflective member in said main body for improving an antenna gain of said antenna device, said reflective member located between said antenna assembly and said rear surface of said main body.

3. A wrist-mounted-type antenna device according to claim 1, further comprising a displaying unit for displaying information on said front surface of said main body, wherein said antenna assembly that is at least partly located in said main body between said front surface and said circuit board is located along an outer edge of said displaying unit.

4. A wrist-mounted-type antenna device according to claim 1, further comprising a displaying unit for displaying information on said front surface of said main body, wherein said antenna assembly that is at least partly located in said main body between said front surface and said circuit board is made of a transparent electrically conductive thin film and is located on said front surface of said main body over said displaying unit.

5. A wrist-mounted-type antenna device according to claim 1, wherein said antenna assembly includes a front surface side that faces away from the user's wrist and a rear surface side that faces toward the user's wrist, and further comprising a material layer having a high dielectric constant coated on at least one of said front surface side and said rear surface side of said antenna assembly.

6. A wrist-mounted-type antenna device according to claim 1, further comprising a pair of wrist bands attached to said main body, portions of said antenna assembly located in said pair of wrist bands so that said antenna assembly and said slot extends through said main body and through said pair of wrist bands.

7. A wrist-mounted-type antenna device comprising:

a main body having an outer frame that defines a cavity and an outer peripheral surface of said main body, and a circuit board located inside said cavity, a circuit arranged on said circuit board; and a slot antenna assembly attached to said outer peripheral surface of said main body and coupled to said circuit board, said antenna assembly including a slot extending along a length of said antenna assembly and having a reactance element connected across sides of said slot near a center of a length of said slot, whereby an electric field is produced across said slot when said antenna device is operated.

8. A wrist-mounted-type antenna device according to claim 7, further comprising a material layer having a high dielectric constant coated on said antenna assembly.

9. A wrist-mounted-type antenna device according to claim 7, wherein said antenna assembly includes a slot extending along a length of said antenna assembly.

10. A wrist-mounted-type antenna device comprising:

a main body, a circuit board located in said main body, a circuit arranged on said circuit board;

a pair of wrist bands connected to said main body; and a slot antenna assembly including a slot extending along a length of said antenna assembly, said antenna assembly having a reactance element connected across sides of said slot near a center of a length of said slot, said antenna assembly attached to said wrist bands and having a first member and a second member located in said main body, said first and second members facing each other across said slot, said first member connected to a reference terminal of a high frequency wave amplifier on said circuit board, said second member connected to a feed terminal of said high frequency wave amplifier, and said second member being located farther than said first member from electromagnetic noise sources radiated by said circuit on said circuit board, whereby an electric field is produced across said slot when said antenna device is operated.

11. A wrist-mounted-type antenna device according to claim 10, wherein said first member is connected to said reference terminal via a reactance element.

12. A wrist-mounted-type antenna device according to claim 10, wherein said first member is electrically connected to a power source for driving said circuit on said circuit board.

13. A wrist-mounted-type antenna device according to claim 10, wherein said first member is electrically connected to a shield member that covers said electro-magnetic noise sources.

14. A wrist-mounted-type antenna device according to claim 10, wherein said main body has a front surface that faces away from a user's wrist when mounted on the user's wrist, and a rear surface that faces toward the user's wrist when mounted on the user's wrist, said second member is disposed on a front surface side of said circuit board that faces toward said front surface of said main body, and said circuit on said circuit board includes a local oscillator arranged on a rear surface side of said circuit board that faces toward said rear surface of said main body.

15. A wrist-mounted-type antenna device according to claim 14, wherein said local oscillator is surrounded by a plurality of components having a same voltage level of said local oscillator.

16. A wrist-mounted-type antenna device according to claim 10, wherein said main body has a front surface that faces away from a user's wrist when mounted on the user's wrist, and a rear surface that faces toward the user's wrist when mounted on the user's wrist, said first member and said second member located between said front surface of said main body and said circuit board.

17. A wrist-mounted-type antenna device according to claim 10, wherein said antenna assembly includes a front surface side that faces away from a user's wrist and a rear surface side that faces toward the user's wrist, and further comprising a material layer having a high dielectric constant coated on at least one of said front surface side and said rear surface side of said antenna assembly.

18. A wrist-mounted-typed antenna device comprising:

a main body, a circuit board in said main body, a plurality of circuits arranged on said circuit board;

a pair of wrist bands connected to said main body;

a slot antenna assembly including a slot extending along a length of said antenna assembly, said antenna assembly coupled to said circuit board located in said main body and said pair of wrist bands, said antenna assembly at least partly located between front surface of said main body and said circuit board and spaced from said plurality of circuits arranged on said circuit board; and a reactance element located at a center of said length of said antenna assembly, said reactance element connecting two portions of said antenna assembly to each other across said slot, whereby an electric field is produced across said slot when said antenna device is operated.

19. A wrist-mounted-type antenna device according to claim 18, wherein said antenna assembly includes a first antenna element and a second antenna element having different lengths, said first antenna element located in a first one of said pair of wrist bands, said second antenna element located in a second one of said pair of wrist bands, said first and second antenna elements connected to each other through said main body, a feeding point to said first and second antenna elements located in said main body and offset a distance from a connecting point of said reactance element.

20. A wrist-mounted-type antenna device according to claim 19, wherein said first antenna element in said first wrist band has a length shorter than a length of said second antenna element in said second wrist band, said first wrist band has a clasp for joining said first and second wrist bands with each other, and said second wrist band that contains said second antenna element having a longer length has at least one clasp-pan receiving hole for receiving a pin of said clasp.

21. A wrist-mounted-type antenna device according to claim 20, wherein said at least one clasp-pin receiving hole of said second wrist band is arranged at a center of a width of said slot.

22. A wrist-mounted-type antenna device according to claim 20, wherein said second antenna element in said second wrist band has an inner diameter corresponding to a diameter of said at least one clasp-pin receiving hole, said second antenna element in said second wrist band arranged at a portion of said antenna assembly corresponding to said clasp-pin receiving hole.

23. A wrist-mounted-type antenna device according to claim 19, wherein said first antenna element has a longer length than said second antenna element, said reactance element located in said first wrist bands with said first antenna element.

24. A wrist-mounted-type antenna device according to claim 23, wherein said first antenna element includes a pair of overlapping portions that project toward said slot from each side of said first antenna element, and said reactance element is a capacitor defined by said overlapping portions and a capacitive material between said overlapping portions, said overlapping portions located at a center of a length of said antenna assembly.

25. A wrist-mounted-type antenna device according to claim 18, wherein said antenna assembly includes a front surface side that faces away from a user's wrist and a rear surface side that faces toward the user's wrist, and further comprising a material layer having a high dielectric constant coated on at least one of said front surface side and said rear surface side of said antenna assembly.

26. A wrist-mounted-type antenna device comprising:

a main body, a circuit board located in said main body, a circuit arranged on said circuit board; and a slot antenna assembly including a slot extending along a length of said antenna assembly and coupled to said circuit board; and a reactance element located at a center of said length of said antenna assembly and connected across said slot, said antenna assembly having a plurality of holes, a density of said holes in said antenna assembly increasing towards said reactance element from a distal portion of said antenna assembly, whereby an electric field is produced across said slot when said antenna device is operated.

27. A wrist-mounted-type antenna device according to claim 26, further comprising a pair of wrist bands attached to said main body, portions of said antenna assembly located in said pair of wrist bands so that said antenna assembly and said slot extends through said main body and through said pair of wrist bands.

28. A wrist-mounted-type antenna device according to claim 26, wherein said reactance element is located in one of said pair of wrist bands.

29. A wrist-mounted-type antenna device according to claim 26, wherein said antenna assembly includes a front surface side that faces away from a user's wrist and a rear surface side that faces toward the user's wrist, and further comprising a material layer having a high dielectric constant coated on at least one of said front surface side and said rear surface side of said antenna assembly.

30. A wrist-mounted-type antenna device comprising:

a main body, a circuit board in said main body, a circuit arranged on said circuit board;

a wrist band connected to said main body;

a slot antenna assembly included a slot extending along a length of said antenna assembly, said antenna assembly attached to said wrist band and extending through said main body; and a reactance element located at a center of said length of said antenna assembly connected across said slot, said wrist band having a rear surface said that faces a user's wrist, a thickness of said rear surface side of said wrist band between said antenna assembly and the user's wrist increasing towards said reactance element relative to portions of said wrist band rear surface said located distal from said reactance element, whereby an electric field is produced across said slot when said antenna device is operated.

31. A wrist-mounted-type antenna device according to claim 30, wherein said wrist band has a plurality of raised portions on said rear surface side, a height of said plurality of raised portions being increased towards said reactance element relative to said distal portion of said wrist band.

32. A wrist-mounted-type antenna device according to claim 30, wherein said reactance element is located in said wrist band.

33. A wrist-mounted-type antenna device according to claim 30, wherein said antenna assembly includes a front surface side that faces away from the user's wrist and a rear surface side that faces toward the user's wrist, and further comprising a material layer having a high dielectric constant coated on at least one of said front surface side and said rear surface side of said antenna assembly.

34. A wrist-mounted-type antenna device comprising:

a main body, a circuit board in said main body, a plurality of circuits arranged on said circuit board; and a slot antenna assembly including a slot extending along a length of said antenna assembly and coupled to said circuit board said antenna assembly having a reactance element connected across sides of said slot near a center of a length of said slot, said antenna assembly being elongated and having distal ends, said antenna assembly including means for reducing resistivity loss at said distal ends in order to reduce a resistivity for a high frequency current, whereby an electric field is produced across said slot when said antenna device is operated.

35. A wrist-mounted-type antenna device according to claim 34, wherein said means for reducing resistivity includes raised and lowered portions on a metallic plate located at least in said distal ends of said antenna assembly, said raised and lowered portions extending in a direction that corresponds to a direction in which current flows through said distal ends of said antenna assembly.

36. A wrist-mounted-type antenna device according to claim 34, wherein said means for reducing resistivity includes a metallic layer having a high electrical conductivity, said metallic layer provided at least on a surface of said distal ends of said antenna assembly.

37. A wrist-mounted-type antenna device according to claim 34, further comprising a pair of wrist bands attached to said main body, portions of said antenna assembly located in said pair of wrist bands so that said antenna assembly and said slot extends through said main body and through said pair of wrist bands, said distal ends of said antenna assembly located in each of the wrist bands of said pair of wrist bands.

38. A wrist-mounted-type antenna device according to claim 35, further comprising a pair of wrist bands attached to said main body, portions of said antenna assembly located in said pair of wrist bands so that said antenna assembly and said slot extends through said main body and through said pair of wrist bands, said distal ends of said antenna assembly located in each of the wrist bands of said pair of wrist bands.

39. A wrist-mounted-type antenna device according to claim 36, further comprising a pair of wrist bands attached to said main body, portions of said antenna assembly located in said pair of wrist bands so that said antenna assembly and said slot extends through said main body and through said pair of wrist bands, said distal ends of said antenna assembly located in each of the wrist bands of said pair of wrist bands.

40. A wrist-mounted-type antenna device according to claim 34, wherein said antenna assembly includes a front surface side that faces away from a user's wrist and a rear surface side that faces toward the user's wrist, and further comprising a material layer having a high dielectric constant coated on at least one of said front surface side and said rear surface side of said antenna assembly.

41. A wrist-mounted-type antenna device comprising:
- a main body having a front surface that faces away from a user's wrist when mounted around said user's wrist, a circuit board in said main body, a circuit arranged on said circuit board;
- a pair of wrist bands connected to said main body and having different lengths; and
- a slot antenna assembly including a slot extending along a length of said antenna assembly, said antenna assembly having a reactance element connected across sides of said slot near a center of a length of said slot, said antenna assembly attached to said pair of wrist bands and extending through said main body, said antenna assembly including a first member and a second member located in said main body and facing each other across said slot, said first and second members positioned on a side of said circuit board that faces said front surface of said main body, said first member connected to a reference terminal of a high frequency wave amplifier, said second member connected to a feed terminal of said high frequency wave amplifier, and said second member being located farther than said first member from electromagnetic noise sources radiated by said plurality of circuits, whereby an electric field is produced across said slot when said antenna device is operated.

42. A wrist-mounted-type antenna device according to claim 41, wherein said antenna assembly includes a front surface side that faces away from the user's wrist and a rear surface side that faces toward the user's wrist, and further comprising a material layer having a high dielectric constant coated on at least one of said front surface side and said rear surface side of said antenna assembly.

43. A wrist-mounted-type portable apparatus comprising:
- a main body having a front surface that faces away from a user's wrist when mounted around the user's wrist, a rear surface that faces toward the user's wrist when mounted around the user's wrist, and a circuit board in said main body between said front surface and said rear surface, a circuit arranged on said circuit board; and
- a slot antenna device, said antenna device including: an antenna assembly including a slot extending along a length of said antenna assembly, said antenna assembly having a reactance element connected across sides of said slot near a center of a length of said slot, said antenna assembly at least partly located in said main body between said front surface and said circuit board and coupled to said circuit board, whereby an electric field is produced across said slot when said antenna device is operated.

44. A wrist-mounted-type portable apparatus comprising:
- a main body, a circuit board in said main body, a circuit arranged on said circuit board;
- a pair of wrist bands connected to said main body;
- a slot antenna device, said slot antenna device including: an antenna assembly including a slot extending along a length of said antenna assembly, said antenna assembly coupled to said circuit board located in said main body and said pair of wrist bands, said antenna assembly at least partly located in said main body between front surface of said main body and said circuit board and spaced from said circuits arranged on said circuit board; and
- a reactance element located at a center of said length of said antenna assembly, said reactance element connecting two portions of said antenna assembly to each other across said slot, whereby an electric field is produced across said slot when said antenna device is operated.

45. A wrist-mounted-type portable apparatus according to claim 44, wherein said circuit includes at least a signal transmit portion so that said portable apparatus is a signal transmitting apparatus.

46. A wrist-mounted-type portable apparatus according to claim 44, wherein said circuit includes at least a receiving portion so that said portable apparatus is a signal receiving apparatus.

* * * * *